(12) United States Patent
Suganuma et al.

(10) Patent No.: US 12,134,146 B2
(45) Date of Patent: Nov. 5, 2024

(54) BONDING MEMBER, METHOD FOR PRODUCING BONDING MEMBER AND METHOD FOR PRODUCING BONDING STRUCTURE

(71) Applicant: OSAKA UNIVERSITY, Osaka (JP)

(72) Inventors: Katsuaki Suganuma, Suita (JP); Chuantong Chen, Suita (JP); Toshiyuki Ishina, Suita (JP); Seungjun Noh, Suita (JP); Chanyang Choe, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 159 days.

(21) Appl. No.: 17/812,352

(22) Filed: Jul. 13, 2022

(65) Prior Publication Data

US 2022/0347799 A1    Nov. 3, 2022

Related U.S. Application Data

(62) Division of application No. 16/487,924, filed as application No. PCT/JP2018/006721 on Feb. 23, 2018, now abandoned.

(30) Foreign Application Priority Data

Feb. 23, 2017 (JP) ................. 2017-032043

(51) Int. Cl.
| B23K 35/00 | (2006.01) |
| B23K 35/30 | (2006.01) |
| B32B 15/01 | (2006.01) |
| H01L 23/00 | (2006.01) |

(52) U.S. Cl.
CPC .......... *B23K 35/3006* (2013.01); *B32B 15/01* (2013.01); *H01L 24/27* (2013.01); *H01L 24/29* (2013.01); *H01L 2224/271* (2013.01); *H01L 2224/278* (2013.01); *H01L 2224/29139* (2013.01); *H01L 2224/32225* (2013.01); *H01L 2924/01047* (2013.01)

(58) Field of Classification Search
CPC .................. C22C 5/06; B23K 35/30
See application file for complete search history.

(56) References Cited

U.S. PATENT DOCUMENTS

| 10,043,775 B2* | 8/2018 | Yamazaki | ............ H05K 3/3463 |
| 2010/0186999 A1* | 7/2010 | Kuramoto | ............ B23K 1/0008 |
| | | | 419/21 |
| 2011/0186340 A1* | 8/2011 | Kuramoto | ............... H01L 24/83 |
| | | | 252/514 |
| 2015/0056382 A1* | 2/2015 | Suganuma | ............. C09D 11/52 |
| | | | 427/108 |
| 2016/0351523 A1* | 12/2016 | Yamazaki | ........... H01L 23/4334 |
| 2020/0039007 A1* | 2/2020 | Suganuma | ............. H01L 24/83 |
| 2022/0230988 A1* | 7/2022 | Suganuma | ............. H01L 24/29 |

FOREIGN PATENT DOCUMENTS

| EP | 0 661 126 A1 | 7/1995 |
| EP | 0 661 126 B1 | 12/1997 |

(Continued)

OTHER PUBLICATIONS

Computer English translation of JP 2016169411A (Year: 2024).*

(Continued)

*Primary Examiner* — Erin B Saad
(74) *Attorney, Agent, or Firm* — Studebaker & Brackett PC

(57) ABSTRACT

A bonding member (10) includes surface-processed silver surfaces (11a, 11b).

7 Claims, 31 Drawing Sheets

(56) References Cited

FOREIGN PATENT DOCUMENTS

| JP | S50-131606 A | 10/1975 |
|---|---|---|
| JP | S54-151536 A | 11/1979 |
| JP | H07-185840 A | 7/1995 |
| JP | 2008-010703 A | 1/2008 |
| JP | 2015-104748 A | 6/2015 |
| WO | 96/07521 A1 | 3/1996 |
| WO | 2015/118790 A1 | 8/2015 |

OTHER PUBLICATIONS

International Search Report issued in PCT/JP2018/006721; mailed Apr. 17, 2018.
The extended European search report issued by the European Patent Office on Nov. 27, 2019, which corresponds to EP18757082.5-1103 and is related to U.S. Appl. No. 16/487,924.
Moore M. A. et al., "Plastic Deformation Below Worn Surfaces", Metallurgical Transactions A-Physical Metallurgy and Materials Science, Springer New York LLC, US, vol. 7, No. 12 Dec. 1, 1976 (Dec. 1, 1976), pp. 1833-1839, XP009517237.
Auer et al., Morphology-induced plasmonic resonances in silver-aluminum alloy thin film, Appl. Phys. Lett. 99, 041116 (2011); pp. 1-3 (Year: 2011).
Lin et al., An experimental study on molecular dynamics simulation in nanometer grinding, Journal of Materials Processing Technology, 138, (2003), pp. 484-488. (Year: 2003).

\* cited by examiner

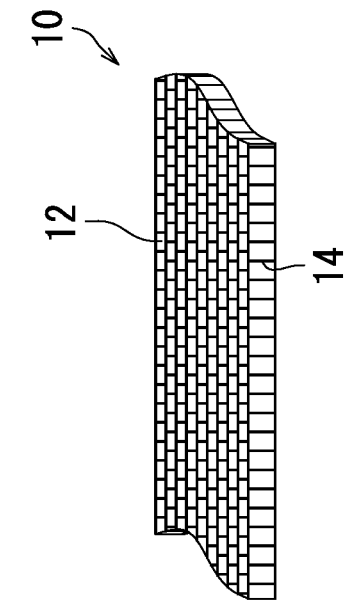
FIG. 3C
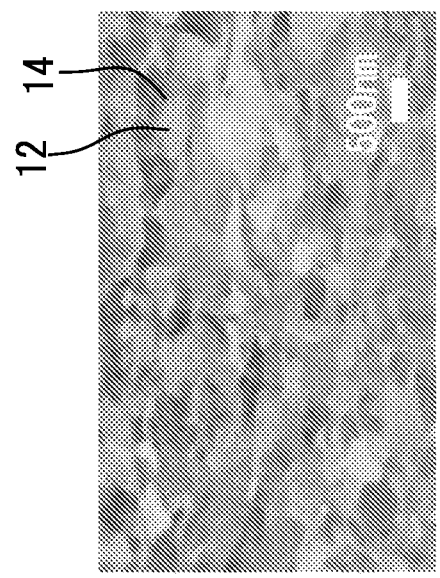
FIG. 3D
FIG. 3A
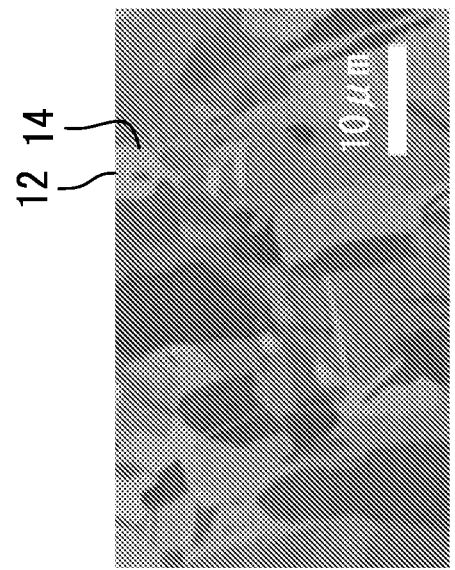
FIG. 3B

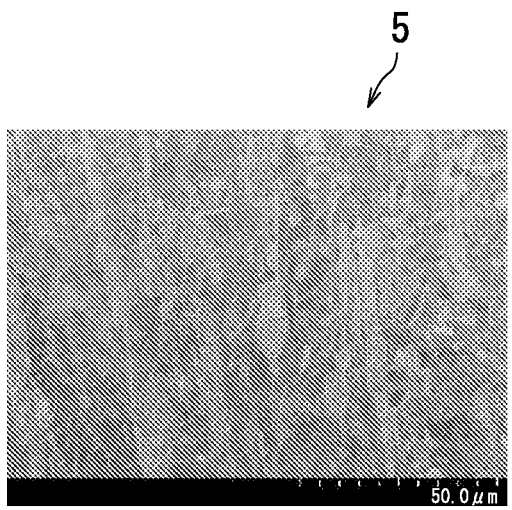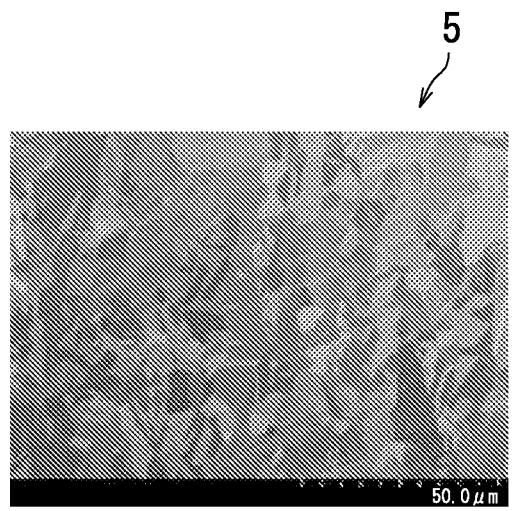
FIG. 11A        FIG. 11B
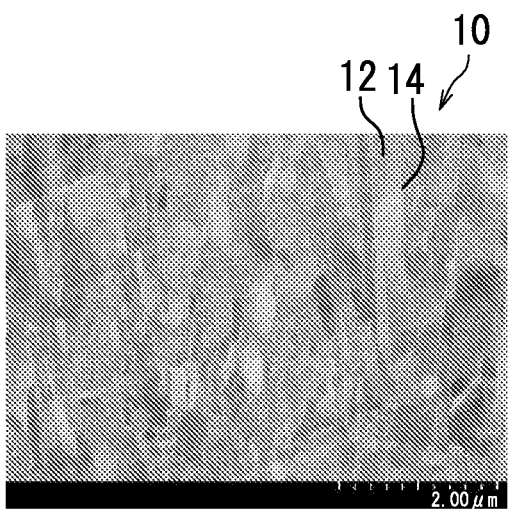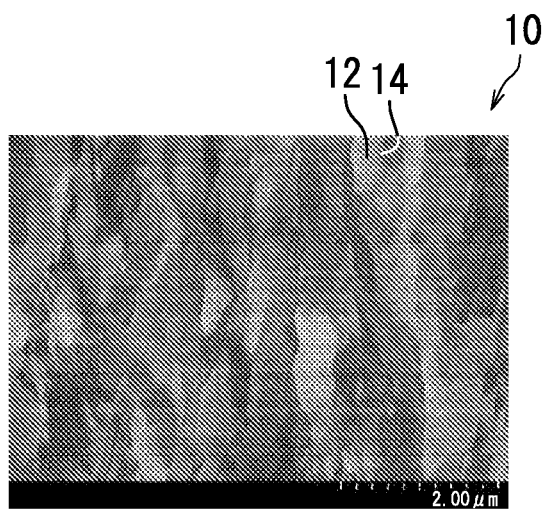
FIG. 11C        FIG. 11D

BONDING MEMBER, METHOD FOR PRODUCING BONDING MEMBER AND METHOD FOR PRODUCING BONDING STRUCTURE

CROSS-REFERENCE TO RELATED APPLICATIONS

This application is a Divisional of U.S. patent application Ser. No. 16/487,924, filed on Aug. 22, 2019, which is the U.S. National Phase of International Application No. PCT/JP2018/006721, filed on Feb. 23, 2018, which claims priority to and the benefit of Japanese Patent Application No. 2017-032043, filed on Feb. 23, 2017, the entire contents of which are incorporated herein by reference.

TECHNICAL FIELD

The present invention relates to a bonding member, a method for producing the bonding member, and a method for producing a bonding structure.

BACKGROUND ART

It is known to bond a plurality of members in contact with each other to integrate the plurality of members. For example, in order to mount a semiconductor element on a substrate, the semiconductor element and the substrate are bonded to each other by a bonding member.

Conventionally, solder that contains lead is in wide use as the bonding member. Recently, however, solder that does not contain lead (lead-free solder) has been progressively studied for environmental protection. Nonetheless, the lead-free solder generally has a higher melting point than that of the solder containing lead. When the lead-free solder is used for bonding at a high temperature, a thermal stress may occasionally destroy bonding targets to be bonded, or cause a void at an interface at which the bonding targets are bonded to each other by solder.

Under such circumstances, it has been studied to use a paste containing metal nano particles as a low-melting point bonding member (e.g., Patent Document 1). Patent Document 1 discloses a method by which a paste is applied to an insulating substrate and then a semiconductor chip is placed on the paste and heated, to bond the semiconductor chip to the insulating substrate. In Patent Document 1, the paste contains metal nano particles, an organic dispersant, a dispersing and capturing agent, and a volatile organic component, and volatilizes gas from the paste when being heated.

CITATION LIST

Patent Literature

[Patent Literature 1]
Japanese Patent Application Laid-Open Publication No. 2008-10703

SUMMARY OF INVENTION

Technical Problem

However, the technique described in Patent Document 1 provides a low shear strength and thus cannot bond the bonding targets in a favorable manner. Especially, bonding targets having a large area size cannot be bonded in a favorable manner.

The present invention, made in light of the above-described problem, has an object of providing a bonding member that bonds bonding targets in a favorable manner, a method for producing such a bonding member, and a method for producing a bonding structure.

Solution to Problem

A bonding member according to the present invention includes a surface-processed silver surface.

In an embodiment, the silver surface is supplied with a compressive stress.

In an embodiment, there are 10 or more grain boundaries, between silver grains, per micrometer at the silver surface.

In an embodiment, the silver grains each have a size of 1 µm or shorter at the silver surface.

In an embodiment, the bonding member has a thickness of 50 µm or greater and 300 µm or less.

In an embodiment, the silver surface is rolled.

In an embodiment, the silver surface is ground.

In an embodiment, the silver surface is a part of a surface of a surface-processed porous silver sheet.

A method for producing a bonding member according to the present invention includes preparing a silver layer; and processing a surface of the silver layer.

In an embodiment, in the processing of the surface of the silver layer, the silver layer is rolled or pressed to process the surface of the silver layer.

In an embodiment, in the processing of the surface of the silver layer, the surface of the silver layer is ground to process the surface of the silver layer.

In an embodiment, in the processing of the surface of the silver layer, the surface of the silver layer is processed such that the number of grain boundaries, between silver grains, at the surface of the silver layer is larger than that in a pre-processing state.

In an embodiment, the silver layer is a porous silver sheet including pores.

In an embodiment, in the processing of the surface of the silver layer, the surface of the silver layer is processed such that the number of the pores at the surface of the silver layer is smaller than that in a pre-processing state.

A method for producing a bonding structure according to the present invention includes preparing a first bonding target, a second bonding target, and a bonding member; forming a stack body including the first bonding target, the bonding member, and the second bonding target stacked such that the bonding member is located between the first bonding target and the second bonding target; and heating the stack body to bond the first bonding target and the second bonding target to each other via the bonding member. In the preparing of the bonding member, the bonding member includes a surface-processed silver surface.

In an embodiment, in the preparing of the first bonding target, the second bonding target, and the bonding member, the bonding member is separate from the first bonding target and the second bonding target.

In an embodiment, in the preparing of the first bonding target, the second bonding target, and the bonding member, the bonding member is formed in advance on at least one of the first bonding target and the second bonding target.

In an embodiment, in the bonding of the first bonding target and the second bonding target, the stack body is heated at a temperature of 150° C. or higher and 350° C. or lower.

Advantageous Effects of Invention

According to the present invention, bonding targets is bonded in a favorable manner.

BRIEF DESCRIPTION OF DRAWINGS

FIG. 3A is a schematic view illustrating a silver layer, FIG. 3B is an SEM photograph of a surface of the silver layer, FIG. 3C is a schematic view illustrating a bonding member according to the present invention, and FIG. 3D is an SEM photograph of a surface of the bonding member according to the present invention.

FIGS. 11A and 11B are SEM photographs of cross-sections of a pre-rolling silver layer, and FIGS. 11C and 11D are SEM photographs of cross-sections of a post-rolling bonding member.

DESCRIPTION OF EMBODIMENTS

Figure 1:
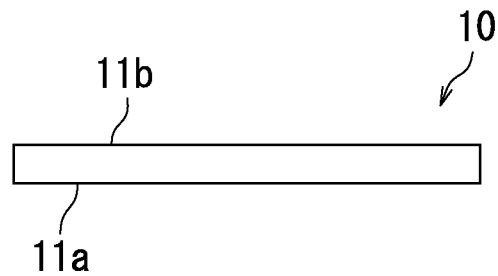
FIG. 1 is a schematic view of a bonding member in an embodiment.

Hereinafter, embodiments of the present invention will be described with reference to the drawings. In the drawings, the same or corresponding portions will bear the same reference signs, and the same descriptions will not be repeated.

With reference to FIG. 1, an embodiment of a bonding member 10 according to the present invention will be described. FIG. 1 is a schematic view of the bonding member 10 in this embodiment. The bonding member 10 is used to bond bonding targets to each other. The bonding member 10 is typically like a thin film.

The bonding member 10 is formed of, for example, silver. The bonding member 10 includes a silver surface 11a and a silver surface 11b. The silver surface 11a and the silver surface 11b are physically supplied with a force. In more detail, the silver surface 11a and the silver surface 11b are surface-processed by being physically supplied with a force. In still more detail, the silver surface 11a and the silver surface 11b are plastically deformed by being surface-processed. The silver surface 11a and the silver surface 11b have a great number of tiny grain boundaries or crystal defects formed thereat by being surface-processed. The "grain boundary" refers to a border between silver grains. The bonding member 10 has a thickness of, for example, 100 nm or greater. The thickness of the bonding member 10 is preferably 50 μm or greater and 300 μm or less, and more preferably 100 μm or greater and 200 μm.

In addition, the silver surface 11a and the silver surface 11b are supplied with a compressive stress by being surface-processed. Namely, the silver surface 11a and the silver surface 11b each have a residual stress having a negative value.

The bonding member 10 typically includes two principal surfaces. In FIG. 1, both of the two principal surfaces of the bonding member 10 are illustrated as being exposed without being in contact with any other member. It should be noted that at least one of the two principal surfaces of the bonding member 10 may be put into contact with a member before the bonding member 10 is put into contact with bonding targets.

When the bonding member 10 is put into contact with the bonding targets and heated, oxygen in the air is absorbed by the grain boundaries or defects, so that silver is oxidized to be liquid silver oxide. The liquid silver oxide is moved to the silver surface 11a and the silver surface 11b, and gushes out therefrom. Since the silver surface 11a and the silver surface 11b are supplied with a compressive stress, the movement of the liquid silver oxide to the silver surface 11a and the silver surface 11b can be promoted. As a result, the liquid silver oxide fills a gap at the interface caused by convexed and concaved portions of the bonding targets to integrate the bonding targets, and concurrently is reduced to metallic silver. Thus, the bonding targets are bonded to each other in a favorable manner. In this manner, the bonding member 10 in this embodiment is usable to produce a bonding structure including the bonding targets bonded to each other.

Figure 2:
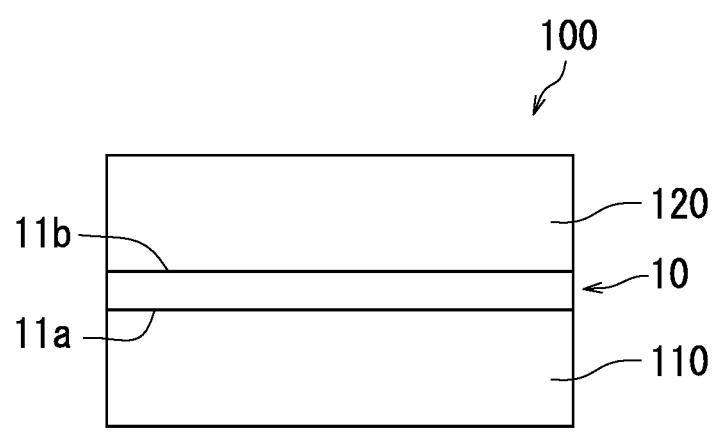
FIG. 2 is a schematic view of a bonding structure in an embodiment.

Hereinafter, with reference to FIG. 2, an embodiment of a bonding structure 100 according to the present invention will be described. FIG. 2 is a schematic view of the bonding structure 100 in this embodiment.

The bonding structure 100 includes the bonding member 10, a first bonding target 110, and a bonding target 120. The bonding member 10 is like a thin film. In the bonding structure 100, the first bonding target 110, the bonding member 10, and the second bonding target 120 are stacked in this order, and the bonding member 10 bonds the first bonding target 110 and the second bonding target 120 to each other. In this example, the bonding member 10 includes the silver surface 11a and the silver surface 11b.

The first bonding target 110 may be any member. The first bonding target 110 is, for example, a substrate. The substrate may be a metal substrate or a metallized insulating substrate.

The metal substrate is formed of, for example, copper, zinc, gold, palladium, aluminum, nickel, cobalt, iron, alumina, tungsten, niobium, molybdenum, titanium, stainless steel, invar alloy (alloy formed of iron, nickel, manganese, and carbon), or kovar alloy (alloy formed of iron, nickel, cobalt, manganese, and silicon). The insulating substrate is formed of, for example, glass, silica glass, silicon, carbon, ceramics, silicon carbide, gallium nitride, gallium nitride formed on silicon, silicon nitride, or aluminum nitride.

The second bonding target 120 may be any member. The second bonding target 120 is, for example, a substrate. The substrate may be a metal substrate or a metallized insulating substrate. The second bonding target 120 may be formed of, for example, any of substantially the same materials as those used to form the first bonding target 110. It is desired to form a silver layer on a surface of the second bonding target 120 in advance in order to provide a certain level of bonding property with silver.

Alternatively, the second bonding target 120 may be a semiconductor element or a wiring line. The semiconductor element is formed of, for example, silicon, carbon, silicon carbide, gallium nitride, gallium nitride formed on silicon, silicon nitride, or aluminum nitride. The wiring line is formed of, for example, copper, zinc, gold, palladium, aluminum, niobium, nickel, cobalt, molybdenum, tungsten, titanium, or iron. It is preferred that the metal used to form the wiring line is copper or iron having silver formed on a surface thereof in order to provide the wiring line with high versatility and high cost performance and also in order to make the wiring line easily bondable with the bonding member 10.

In the bonding structure 100 in this embodiment, as described above, the liquid silver oxide fills the gap at the interface caused by the convexed and concaved portions of the bonding targets and is changed into metallic silver, so as to integrate and bond the first bonding target 110 and the second bonding target 120 to each other. In general, silver oxide in silver crystals progressively melts at a temperature lower than a general metal sintering temperature. Therefore, the bonding structure 100 in this embodiment realizes favorable bonding even under a low-temperature environment. Even in the case where either one of the first bonding target 110 and the second bonding target 120 has a relatively low resistance against heat, the first bonding target 110 and the second bonding target 120 are bonded to each other in a favorable manner. Since a large-scale device such as a heating furnace or the like is not needed, bonding can be performed with a simple process at low cost. In addition, bonding can be performed simply with a versatile metal material.

Hereinafter, with reference to FIGS. 3A-3D, an example of method for producing the bonding member 10 according to the present invention will be described. FIG. 3A is a schematic view of a silver layer 5. FIG. 3B is an SEM photograph of a surface of the silver layer 5. FIG. 3C is a schematic view illustrating the bonding member 10 according to the present invention. FIG. 3D is an SEM photograph of a surface of the bonding member 10 according to the present invention. The method for producing the bonding member 10 in this embodiment includes a preparation step and a processing step.

First, as illustrated in FIG. 3A, the silver layer 5 is prepared (preparation step).

As shown in FIG. 3B, the silver 5 includes a plurality of silver grains 12. Grain boundaries 14 are formed between the silver grains 12.

Next, a force is physically applied to the surface of the silver layer 5 to process the surface of the silver layer 5 (processing step). In more detail, a force is physically applied to the surface of the silver layer 5 to process the surface of the silver layer 5 such that the surface is plastically deformed. For example, in the processing step, the silver layer 5 is rolled or pressed to have a force physically applied to a surface thereof, so that the surface of the silver layer 5 is processed. Alternatively, in the processing step, the surface of the silver layer 5 may be ground to be physically supplied with a force, so that the surface of the silver layer 5 is processed. The surface of the silver layer 5 may be, for example, mechanically ground or manually ground (polished). Alternatively, the surface of the silver layer 5 may be ground by friction stir welding (FSW). Still alternatively, in the processing step, the surface of the silver layer 5 may be shot-peened to be physically supplied with a force, so that the surface of the silver layer 5 is processed.

As illustrated in FIG. 3C, the bonding member 10 includes the plurality of silver grains 12. The grain boundaries 14 are formed between the silver grains 12.

As shown in FIG. 3D, the number of the grain boundaries 14 is larger than in a pre-processing state in FIG. 3B. For example, the number of the grain boundaries, between the silver grains, present per micrometer at a silver surface is 10 or more. The size of each of the silver grains 12 is shorter than in the pre-processing state at the silver surface. For example, the size of each silver grain 12 in the pre-processing state is 2 μm or longer and 10 μm or shorter, whereas the size of each silver grain 12 in a post-processing state is 1 μm or shorter.

As can be seen, according to the method for producing the bonding member 10, in the processing step, the surface of the silver layer 5 is physically supplied with a force and thus is surface-processed such that the number of the grain boundaries 14 between the silver grains 12 at the surface of the bonding member 10 is larger than in the pre-processing state.

Figure 4A:
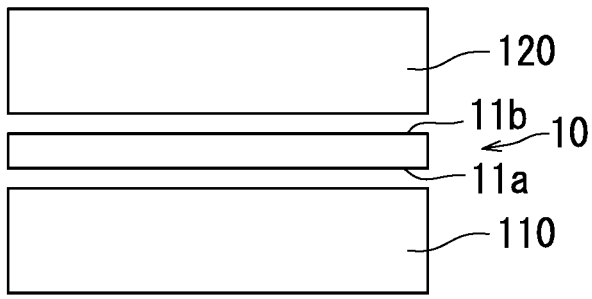
FIGS. 4A-4C are schematic views illustrating a method for producing the bonding structure in an embodiment.
Figure 4B:
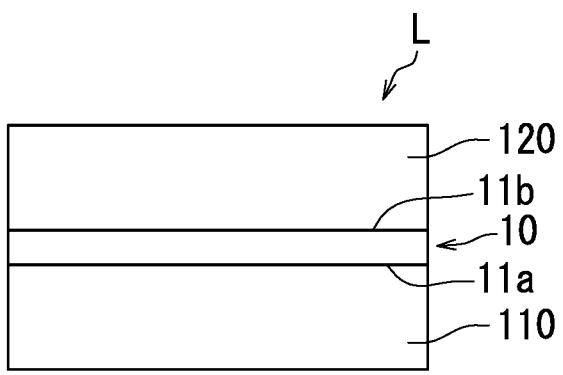
Figure 4C:
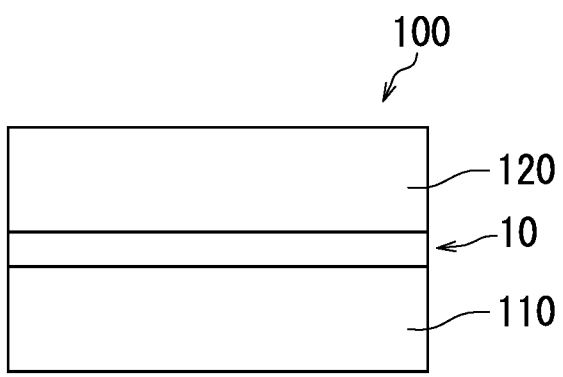

Now, with reference to FIGS. 4A-4C, an example of method for producing the bonding structure 100 according to an embodiment will be described. FIGS. 4A-4C are schematic views illustrating an example of method for producing the bonding structure 100 in this embodiment. The bonding structure 100 includes the above-described bonding member 10, the first bonding target 110, and the second bonding target 120. Overlapping descriptions will be omitted in order to avoid redundancy.

As illustrated in FIG. 4A, the first bonding target 110, the second bonding target 120, and the bonding member 10 are prepared (preparation step). The bonding member 10 is like a thin film. The bonding member 10 includes the silver surface 11a and the silver surface 11b. The silver surface 11a and the silver surface 11b are physically supplied with a force. In more detail, the silver surface 11a and the silver surface 11b are surface-processed by being physically supplied with a force. In still more detail, the silver surface 11a and the silver surface 11b are plastically deformed by being surface-processed. In this embodiment, in the preparation step, the bonding member 10 is separate from the first bonding target 110 and the second bonding target 120. Therefore, the silver surface 11a and the silver surface 11b are exposed.

As illustrated in FIG. 4B, a stack body L including the bonding member 10 located between the first bonding target 110 and the second bonding target 120 is formed (stack body formation step). The first bonding target 110 is in contact with the silver surface 11a of the bonding member 10. The second bonding target 120 is in contact with the silver surface 11b of the bonding member 10. In the stack body L, the first bonding target 110 and the second bonding target 120 are stacked on each other via the bonding member 10.

Alternatively, the bonding member 10 may be in indirect contact with the first bonding target 110 via another layer. For example, an adhesive layer may be provided between the bonding member 10 and the first bonding target 110. The adhesive layer is formed of, for example, titanium or titanium nitride. The adhesive layer has a thickness of, for example, 0.01 μm or greater and 0.05 μm or less. Alternatively, as described below, a silver layer may be provided between the bonding member 10 and the first bonding target 110. Similarly, the bonding member 10 may be in indirect contact with the second bonding target 120 via another layer. Alternatively, as described below, a silver layer may be provided between the bonding member 10 and the second bonding target 120.

As illustrated in FIG. 4C, the stack body L is heated to move the liquid silver oxide to the silver surface 11a and the silver surface 11b, so that the bonding member 10 bonds the first bonding target 110 and the second bonding target 120 to each other to produce the bonding structure 100 (bonding step). The stack body L is heated by use of, for example, a hot plate, a heating furnace, or rapid thermal anneal (RTA).

It is preferred that the stack body L is heated at a heating temperature of 150° C. or higher and 350° C. or lower. For example, the stack body L is heated for preferably 15 minutes or longer and 5 hours or shorter, more preferably 30 minutes or longer and 3 hours or shorter.

The stack body L is heated, and as a result, the liquid silver oxide is moved to the silver surface 11a and the silver surface 11b and gushes out therefrom. When reaching the silver surface 11a and the silver surface 11b, the liquid silver oxide is reduced to be decomposed into silver and oxygen. The silver obtained as a result of the decomposition fills the gap at the interface caused by the convexed and concaved portions of the bonding targets to integrate the bonding targets. Thus, the silver surface 11a of the bonding member 10 and the first bonding target 110 are bonded to each other at the interface, and the silver surface 11b of the bonding member 10 and the second bonding target 120 are bonded to each other at the interface. In this manner, the bonding member 10 bonds the first bonding target 110 and the second bonding target 120 to each other. As a result, the bonding structure 100 is produced.

The first bonding target 110 and the second bonding target 120 may be bonded to each other by applying a pressure to the stack body L. In this embodiment, the bonding structure 100 is produced by use of the bonding member 10 including the silver surfaces that are surface-processed by being physically supplied with a force. Therefore, the first bonding target 110 and the second bonding target 120 can be bonded to each other at a relatively low pressure. For example, the first bonding target 110 and the second bonding target 120 can be bonded to each other with no pressure or at a pressure of 1 MPa or lower.

According to this embodiment, the first bonding target 110 and the second bonding target 120 are bonded to each other by use of the bonding member 10 including the silver surfaces that are surface-processed by being physically supplied with a force. Therefore, the first bonding target 110 and the second bonding target 120 can be bonded to each other in a favorable manner even at a relatively low heating temperature. Thus, heat during the heating can be suppressed from destroying the first bonding target 110 and/or the second bonding target 120, or from causing a void at, or in the vicinity of, a portion in which the first bonding target 110 and the second bonding target 120 are bonded to each other.

According to the method for producing the bonding structure 100 described above with reference to FIGS. 4A-4C, in the preparation step of preparing the bonding member 10, the bonding member 10 includes the silver surface 11a and the silver surface 11b surface-processed by being physically supplied with a force. Therefore, a great number of grain boundaries are formed at the silver surface 11a and the silver surface 11b. For this reason, in the bonding step, a large amount of oxygen in the air can be taken through the grain boundaries and the defects. This can promote the generation of the liquid silver oxide in the bonding step. In addition, the silver surface 11a and the silver surface 11b are supplied with a compressive stress. Therefore, the movement of the liquid silver oxide to the silver surface 11a and the silver surface 11b can be promoted. Therefore, the movement of the liquid silver oxide to the silver surface 11a and the silver surface 11b can be promoted. As a result, the first bonding target 110 and the second bonding target 120 can be bonded to each other in a favorable manner.

Figure 5A:
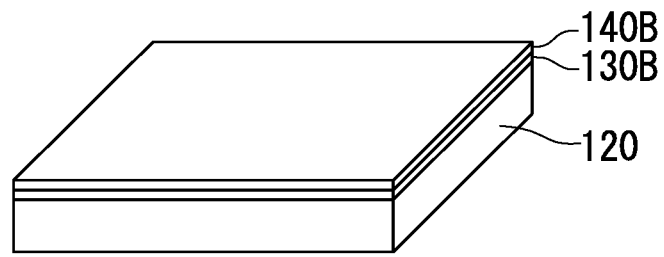
FIG. 5A is a schematic view illustrating a second bonding target.
Figure 5B:
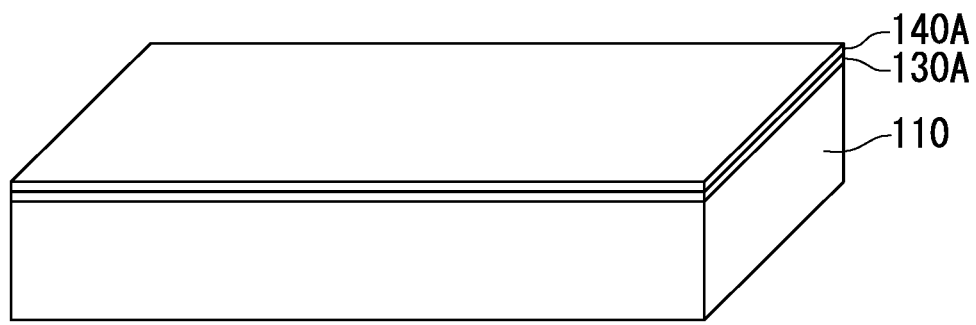
FIG. 5B is a schematic view illustrating a first bonding target.
Figure 6A:
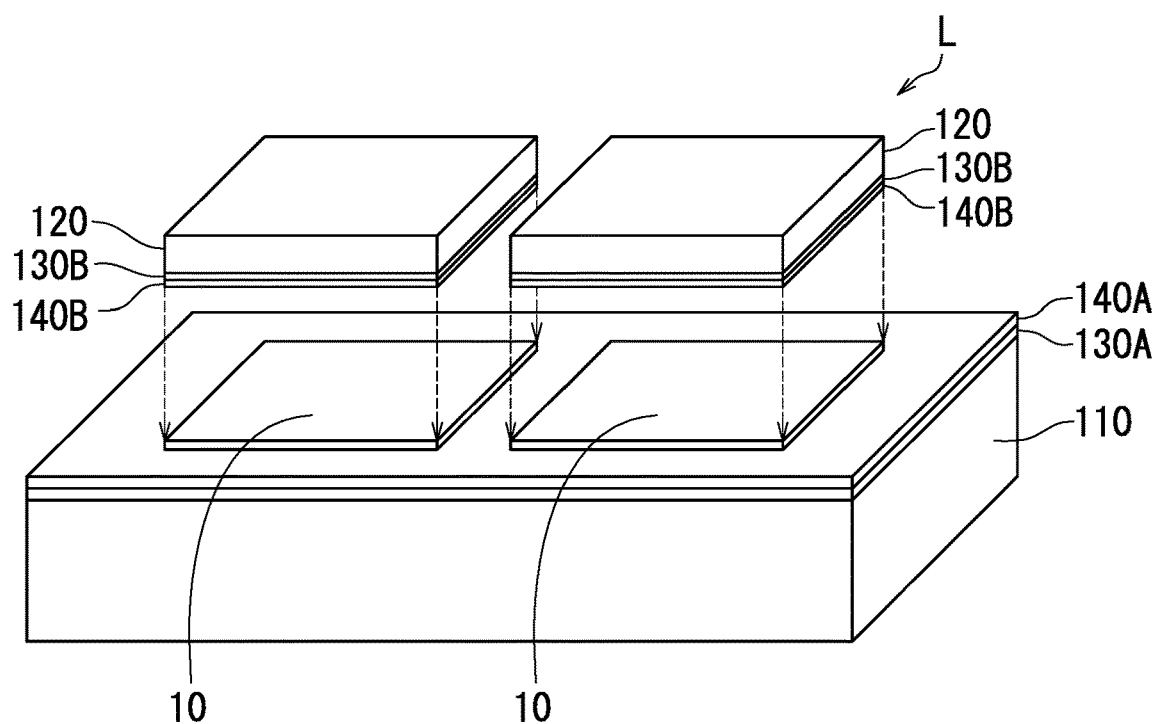
FIG. 6A is a schematic view illustrating a stack body.
Figure 6B:
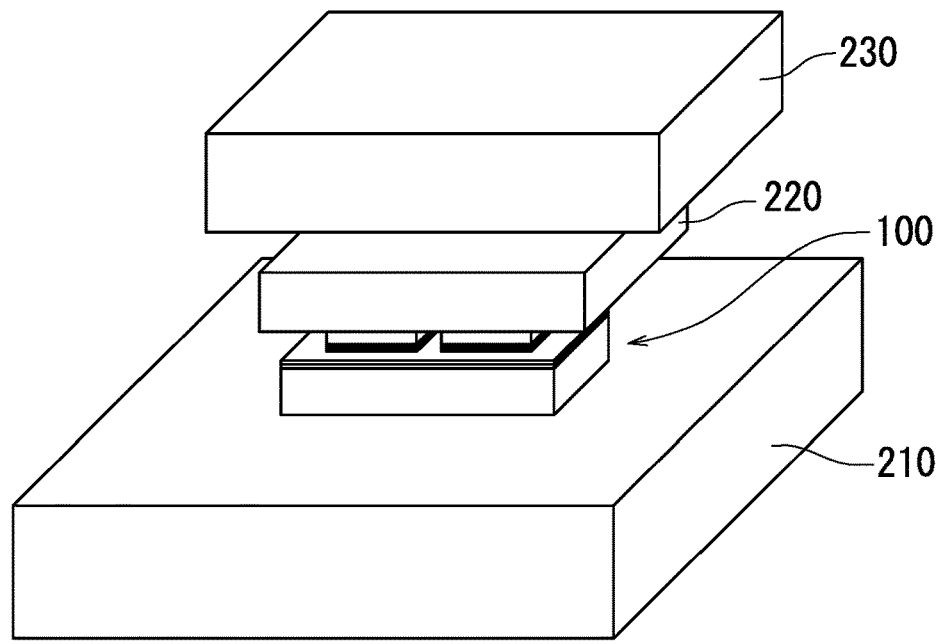
FIG. 6B is a schematic view of a bonding step in the method for producing the bonding structure.

With reference to FIGS. 5A and 5B and FIGS. 6A and 6B, the method for producing the bonding structure in this embodiment will be further described. FIG. 5A is a schematic view illustrating the second bonding target 120. FIG. 5B is a schematic view illustrating the first bonding target 110. FIG. 6A is a schematic view illustrating the stack body L. FIG. 6B is a schematic view of the bonding step in the method for producing the bonding structure 100.

As illustrated in FIG. 5A, in the preparation step, the second bonding target 120 is prepared. The second bonding target 120 is a silicon substrate. The silicon substrate has a size of 3 mm (length)×3 mm (width)×0.5 mm (thickness).

An adhesive layer 130B was formed on the surface of the second bonding target 120 by sputtering. The adhesive layer 130B is formed of titanium. The adhesive layer 130B has a thickness of 100 nm.

A silver layer 140B was formed on a surface of the adhesive layer 130B. The silver layer 140B is formed of silver. The silver layer 140B has a thickness of 1 μm.

As illustrated in FIG. 5B, in the preparation step, the first bonding target 110 is prepared. The first bonding target 110 is a copper substrate. The copper substrate has a size of 8 mm (length)×14 mm (width)×0.8 mm (thickness).

An adhesive layer 130A was formed on the surface of the first bonding target 110 by sputtering. The adhesive layer 130A is formed of titanium. The adhesive layer 130A has a thickness of 100 nm.

A silver layer 140A was formed on a surface of the adhesive layer 130A. The silver layer 140A is formed of silver. The silver layer 140A has a thickness of 1 μm.

As illustrated in FIG. 6A, in a step of forming the stack body L, the first bonding target 110 illustrated in FIG. 5B, the bonding member 10, and the second bonding target 120 illustrated in FIG. 5A are formed such that the bonding member 10 is located between the first bonding target 110 and the second bonding target 120.

The bonding member 10 is produced by rolling a silver sheet. For example, two rollers are rotated, and the silver sheet is inserted between the two rollers to be rolled. In this embodiment, silver sheets respectively having thicknesses of 0.3 mm, 0.5 mm, and 1 mm in a pre-rolling state are rolled to have a thickness of 0.1 mm, so that the bonding members 10 are produced. The silver sheets having the thicknesses of 0.3 mm, 0.5 mm, and 1 mm in the pre-rolling state respectively have pressurizing ratios of 66%, 80%, and 90%. The rolled bonding members 10 were cut into a size slightly larger than that of the second bonding target 120.

In this embodiment, two bonding targets 120 are located on the first bonding target 110.

As illustrated in FIG. 6B, in the bonding step, the stack body L illustrated in FIG. 6A is placed on a hot plate 210 and heated. The stack body L is heated at a heating temperature of 150° C. or higher and 350° C. or lower. In the bonding step, the stack body L is pressurized by a weight 230 via a ceramic plate 220.

According to the method for producing the bonding structure 100 described above with reference to FIGS. 4A-4C, in the preparation step, the bonding member 10 is separate from the first bonding target 110 and the second bonding target 120. In the preparation step, the bonding member 10 may be formed in advance on at least one of the first bonding target 110 and the second bonding target 120.

Now, with reference to FIGS. 7A-7D, an example of method for producing a bonding structure 100 according to an embodiment will be described. FIGS. 7A-7D are schematic views illustrating the method for producing the bonding structure 100 in this embodiment. According to the production method in this embodiment described with reference to FIGS. 7A-7D, in the preparation step, the bonding member 10 is formed in advance on each of the first bonding target 110 and the second bonding target 120. Except for this, the production method in this embodiment described with reference to FIGS. 7A-7D is substantially the same as the method for producing the bonding structure 100 described above with reference to FIGS. 4A-4C. Overlapping descriptions will be omitted in order to avoid redundancy.

Figure 7A:
FIGS. 7A-7D are schematic views illustrating a method for producing a bonding structure in an embodiment.
Figure 7A:
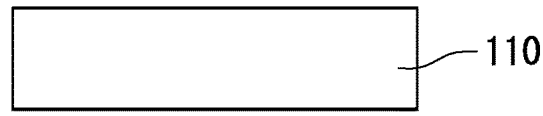

As illustrated in FIG. 7A, the first bonding target 110 and the second bonding target 120 are prepared (preparation step).

Figure 7B:
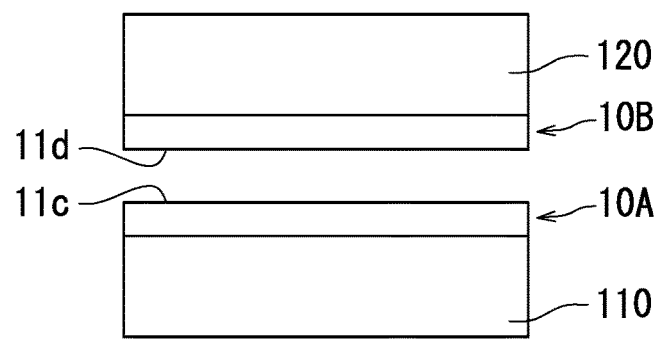

As illustrated in FIG. 7B, the bonding member 10 is formed on each of the first bonding target 110 and the second bonding target 120. In this example, a bonding member 10A is formed on the surface of the first bonding target 110, and a bonding member 10B is formed on the surface of the second bonding target 120. As can be seen, in this embodiment, in the preparation step, the bonding member 10 is formed in advance on each of the first bonding target 110 and the second bonding target 120.

A silver surface 11c of the bonding member 10A is exposed. The bonding member 10A may be in direct contact with the first bonding target 110, or may be in indirect contact with the first bonding target 110 via another layer. For example, an adhesive layer may be provided between the bonding member 10A and the first bonding target 110. The adhesive layer is formed of, for example, titanium or titanium nitride. The adhesive layer has a thickness of, for example, 0.01 μm or greater and 0.05 μm or less. Alternatively, as described below, a silver layer may be provided between the bonding member 10A and the first bonding target 110.

A silver surface 11d of the bonding member 10B is exposed. The bonding member 10B may be in direct contact with the second bonding target 120, or may be in indirect contact with the second bonding target 120 via another layer. An adhesive layer may be provided between the bonding member 10B and the second bonding target 120. Alternatively, as described below, a silver layer may be provided between the bonding member 10B and the second bonding target 120.

After the bonding member 10A is formed on the surface of the first bonding target 110, the first bonding target 110 and the bonding member 10A may be exposed to an oxygen atmosphere as necessary. Similarly, after the bonding member 10B is formed on the surface of the second bonding target 120, the second bonding target 120 and the bonding member 10B may be exposed to an oxygen atmosphere as necessary.

Figure 7C:
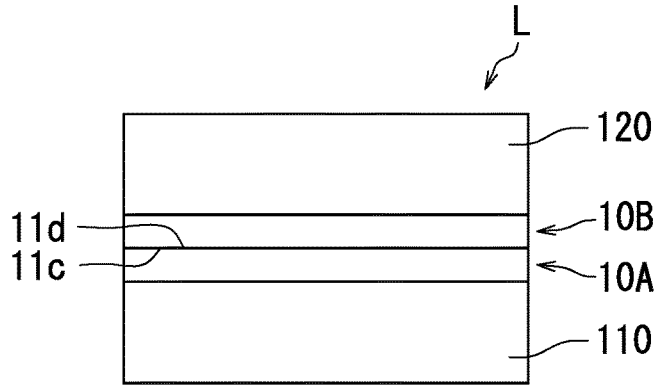

As illustrated in FIG. 7C, a stack body L including the bonding members 10A and 10B located between the first bonding target 110 and the second bonding target 120 is formed (stack body formation step). In the stack body L, the bonding member 10A faces the bonding member 10B, and the silver surface 10c is in contact with the silver surface 10d. In the stack body L, the first bonding target 110 and the second bonding target 120 are stacked on each other via the bonding members 10A and 10B.

Figure 7D:
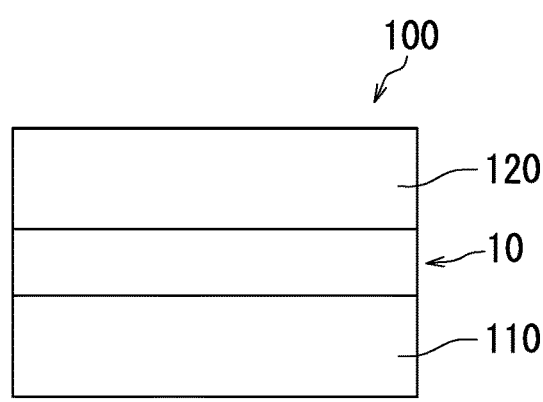

As illustrated in FIG. 7D, the stack body L is heated to move the liquid silver oxide to the silver surface 11c and the silver surface 11d, so that the bonding member 10 bonds the first bonding target 110 and the second bonding target 120 to each other. As a result, the bonding structure 100 is produced. The stack body L is heated, and as a result, the liquid silver oxide is moved to the silver surfaces.

When the liquid silver oxide is moved to the silver surface 11c and the silver surface 11d, the bonding member 10 including the bonding members 10A and 10B integrated together is formed. The bonding member 10 bonds the first bonding target 110 and the second bonding target 120 to each other. As a result, the bonding structure 100 is produced. In the bonding member 10 in a post-heating state, an interface between the two layers derived from the bonding members 10A and 10B may or may not be clearly specifiable.

The stack body L is heated by use of, for example, a hot plate, a heating furnace, or rapid thermal anneal. It is preferred that the stack body L is heated at a heating temperature of 150° C. or higher and 350° C. or lower.

The first bonding target 110 and the second bonding target 120 may be bonded to each other by applying a pressure to the stack body L. In this embodiment, the bonding structure 100 is produced by use of the bonding members 10A and 10B each including the silver surfaces that are surface-processed by being physically supplied with a force. Therefore, the first bonding target 110 and the second bonding target 120 can be bonded to each other at a relatively low pressure. For example, the first bonding target 110 and the second bonding target 120 can be bonded to each other with no pressure or at a pressure of 1 MPa or lower.

According to this embodiment, the first bonding target 110 and the second bonding target 120 are bonded to each other by use of the bonding members 10A and 10B each including the silver surfaces that are surface-processed by being physically supplied with a force. Therefore, the first bonding target 110 and the second bonding target 120 can be bonded to each other in a favorable manner even at a relatively low heating temperature. Thus, heat during the heating can be suppressed from destroying the first bonding target 110 and/or the second bonding target 120, or from causing a void at, or in the vicinity of, a portion in which the first bonding target 110 and the second bonding target 120 are bonded to each other.

After the bonding member 10A or 10B is formed in advance on at least one of the first bonding target 110 and the second bonding target 120, the bonding structure 100 may be produced by use of a bonding member 10C separate from the first bonding target 110 and the second bonding target 120.

Now, with reference to FIGS. 8A-8D, an example of method for producing a bonding structure 100 according to an embodiment will be described. FIGS. 8A-8D are schematic views illustrating the method for producing the bonding structure 100 in this embodiment. According to the production method in this embodiment described with reference to FIGS. 8A-8D, in the preparation step, after a bonding member is formed in advance on each of the first bonding target 110 and the second bonding target 120, a bonding member separate from the first bonding target 110 and the second bonding target 120 is prepared. Except for this, the production method in this embodiment described with reference to FIGS. 8A-8D is substantially the same as the method for producing the bonding structure 100 described above with reference to FIGS. 7A-7D. Overlapping descriptions will be omitted in order to avoid redundancy.

Figure 8A:
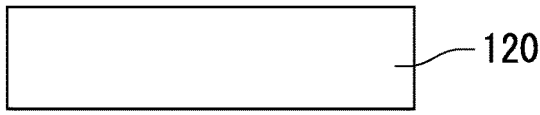
FIGS. 8A-8D are schematic views illustrating a method for producing a bonding structure in an embodiment.
Figure 8A:

As illustrated in FIG. 8A, the first bonding target 110 and the second bonding target 120 are prepared (preparation step).

Figure 8B:
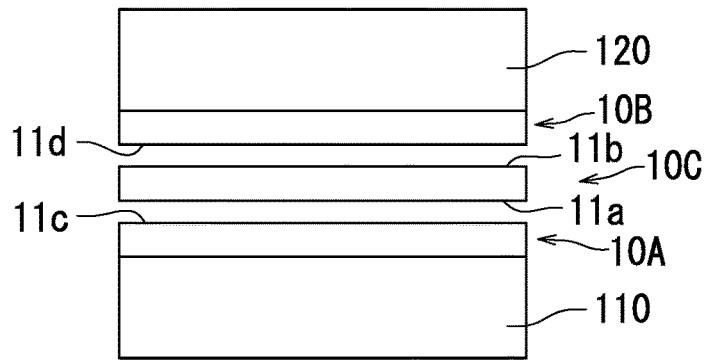

As illustrated in FIG. 8B, the bonding member 10 is formed on each of the first bonding target 110 and the second bonding target 120. In this example, the bonding member 10A is formed on the surface of the first bonding target 110, and the bonding member 10B is formed on the surface of the second bonding target 120. As can be seen, in this embodiment, in the preparation step, the bonding member 10 is formed in advance on each of the first bonding target 110 and the second bonding target 120.

The silver surface 11c of the bonding member 10A is exposed. The bonding member 10A may be in direct contact with the first bonding target 110, or may be in indirect contact with the first bonding target 110 via another layer. For example, an adhesive layer may be provided between the bonding member 10A and the first bonding target 110. The adhesive layer is formed of, for example, titanium or titanium nitride. The adhesive layer has a thickness of, for example, 0.01 µm or greater and 0.05 µm or less. Alternatively, as described below, a silver layer may be provided between the bonding member 10A and the first bonding target 110.

The silver surface 11d of the bonding member 10B is exposed. The bonding member 10B may be in direct contact with the second bonding target 120, or may be in indirect contact with the second bonding target 120 via another layer. An adhesive layer may be provided between the bonding member 10B and the second bonding target 120. Alternatively, as described below, a silver layer may be provided between the bonding member 10B and the second bonding target 120.

After the bonding member 10A is formed on the surface of the first bonding target 110, the first bonding target 110 and the bonding member 10A may be exposed to an oxygen atmosphere as necessary. Similarly, after the bonding member 10B is formed on the surface of the second bonding target 120, the second bonding target 120 and the bonding member 10B may be exposed to an oxygen atmosphere as necessary.

In this embodiment, the bonding member 10C is prepared in addition to the first bonding target 110, the second bonding target 120, the bonding member 10A, and the bonding member 10B. The bonding member 10C is like a thin film. The bonding member 10C includes the silver surface 11a and the silver surface 11b. In this embodiment, in the preparation step, the bonding member 10C is separate from the first bonding target 110 and the second bonding target 120. Therefore, the silver surface 11a and the silver surface 11b are exposed.

Figure 8C:
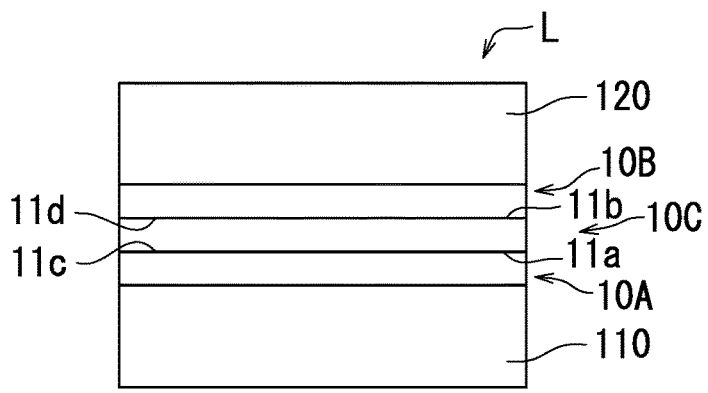

As illustrated in FIG. 8C, a stack body L including the bonding members 10A, 10C, and 10B located between the first bonding target 110 and the second bonding target 120 is formed (stack body formation step). In the stack body L, the bonding member 10A faces the bonding member 10C, and the silver surface 11c is in contact with the silver surface 11a. In the stack body L, the bonding member 10B faces the bonding member 10C, and the silver surface 11d is in contact with the silver surface 11b. In the stack body L, the first bonding target 110 and the second bonding target 120 are stacked on each other via the bonding members 10A, 10C, and 10B.

Figure 8D:
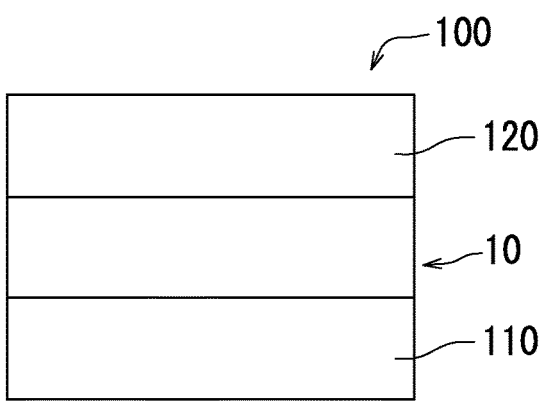

As illustrated in FIG. 8D, the stack body L is heated to move the liquid silver oxide to the silver surface 11a and the silver surface 11b, so that the bonding member 10 bonds the first bonding target 110 and the second bonding target 120 to each other. As a result, the bonding structure 100 is produced. The stack body L is heated, and as a result, the liquid silver oxide is moved to the silver surfaces.

When the liquid silver oxide is moved to the silver surface 11a and the silver surface 11b, the bonding member 10 including the bonding members 10A and 10B integrated together is formed. The bonding member 10 bonds the first bonding target 110 and the second bonding target 120 to each other. The bonding member 10 bonds the first bonding target 110 and the second bonding target 120 to each other. As a result, the bonding structure 100 is produced. In the bonding member 10 in a post-heating state, an interface between the two layers derived from the bonding members 10A and 10B may or may not be clearly specifiable.

The stack body L is heated by use of, for example, a hot plate, a heating furnace, or rapid thermal anneal It is preferred that the stack body L is heated at a heating temperature of 250° C. or higher and 350° C. or lower.

The first bonding target 110 and the second bonding target 120 may be bonded to each other by applying a pressure to the stack body L. In this embodiment, the bonding structure 100 is produced by use of the bonding members 10A, 10B, and 10C each including the silver surfaces that are surface-processed by being physically supplied with a force. Therefore, the first bonding target 110 and the second bonding target 120 can be bonded to each other at a relatively low pressure. For example, the first bonding target 110 and the second bonding target 120 can be bonded to each other with no pressure or at a pressure of 1 MPa or lower.

According to this embodiment, the first bonding target 110 and the second bonding target 120 are bonded to each other by use of the bonding members 10A, 10B, and 10C each including the silver surfaces that are surface-processed by being physically supplied with a force. Therefore, the first bonding target 110 and the second bonding target 120 can be bonded to each other in a favorable manner even at a relatively low heating temperature. Thus, heat during the heating can be suppressed from destroying the first bonding target 110 and/or the second bonding target 120, or from causing a void at, or in the vicinity of, a portion in which the first bonding target 110 and the second bonding target 120 are bonded to each other.

The bonding member 10 may be formed of a polymer containing silver grains dispersed therein.

Figure 9A:
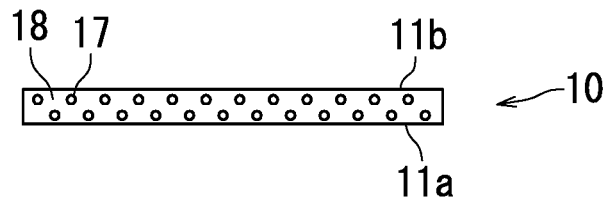
FIG. 9A is a schematic view of a bonding member in an embodiment.
Figure 9B:
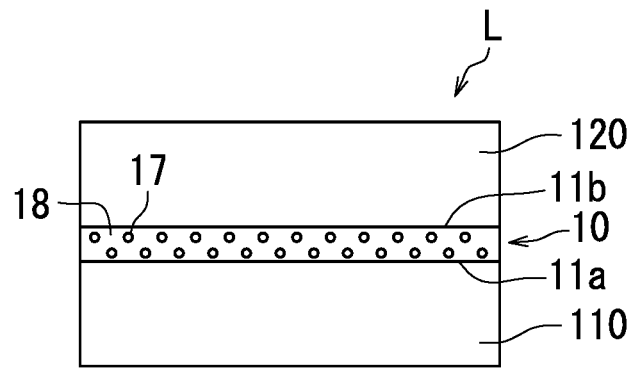
FIGS. 9B and 9C are schematic views illustrating a method for producing a bonding structure in an embodiment.
Figure 9C:
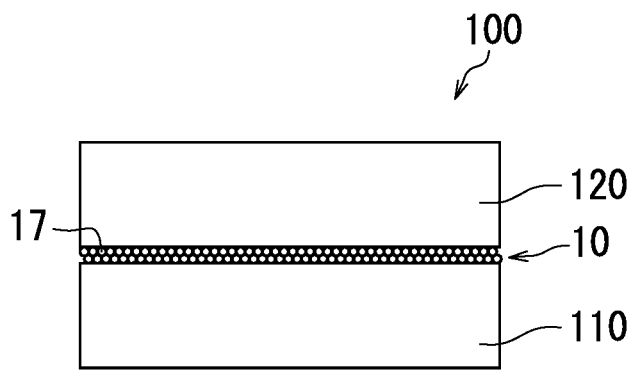

With reference to FIGS. 9A-9C, an embodiment of a bonding member 10 and a bonding structure 100 according to the present invention will be described. FIG. 9A is a schematic view of the bonding member 10 in this embodiment. FIGS. 9B and 9C are schematic views illustrating a method for producing the bonding structure 100 in this embodiment.

First, with reference to FIG. 9A, an embodiment of the bonding member 10 according to the present invention will be described. As illustrated in FIG. 9A, the bonding member 10 contains silver grains 17 and a polymer 18. In more detail, in the bonding member 10, the silver grains 17 are dispersed in the polymer 18. The polymer is, for example, polyvinyl alcohol. The bonding member 10 includes the silver surface 11a and the silver surface 11b. The silver surface 11a and the silver surface 11b are physically supplied with a force. In more detail, the silver surface 11a and the silver surface 11b are surface-processed by being physically supplied with a force. In still more detail, the silver surface 11a and the silver surface 11b are plastically deformed by being surface-processed.

It is preferred that the silver grains 17 have a volume occupying 30% or more of the total volume of the bonding member 10. It is preferred that the silver grains 17 have a volume occupying 55% or more of the total composition of the bonding member 10.

Now, with reference to FIGS. 9B and 9C, an embodiment of the bonding structure 100 according to the present invention will be described.

First, as illustrated in FIG. 9B, a stack body L including the bonding member 10 located between the first bonding target 110 and the second bonding target 120 is formed. The first bonding target 110 is in contact with the silver surface 11a of the bonding member 10. The second bonding target 120 is in contact with the silver surface 11b of the bonding member 10. In the stack body L, the first bonding target 110 and the second bonding target 120 are stacked on each other via the bonding member 10.

As illustrated in FIG. 9C, the polymer 18 in the bonding member 10 is melted to be removed from the bonding member 10. For example, the polymer 18 can be melted by warm water to be removed from the bonding member 10. The stack body L is heated to move the liquid silver oxide to the silver surface 11a and the silver surface 11b, so that the bonding member 10 bonds the first bonding target 110 and the second bonding target 120 to each other. As a result, the bonding structure 100 is produced.

With reference to FIGS. 10A-12D, a composition of the bonding member 10 to be processed will be described. FIGS. 10A, 10B, 11A, 11B, 12A, and 12B are SEM photographs of cross-sections of the silver layers 5 in a pre-rolling state. FIGS. 10C, 10D, 11C, 11D, 12C, and 12D are SEM photographs of cross-sections of the bonding members 10 in a post-rolling state. In FIGS. 10A, 10B, 11A, 11B, 12A, and 12B, the scale is 50 μm. In FIGS. 10C, 10D, 11C, 11D, 12C, and 12D, the scale is 2 μm.

Figure 10A:
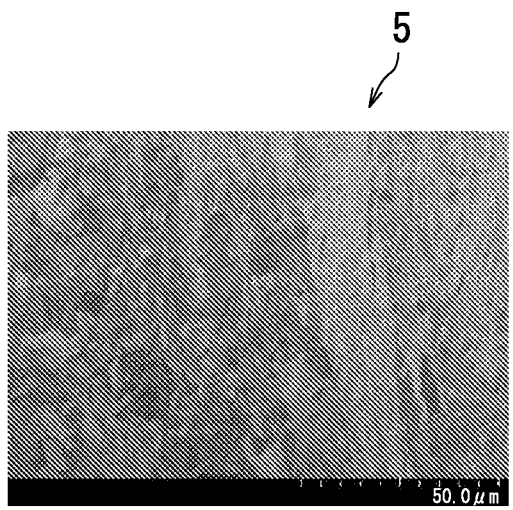
FIGS. 10A and 10B are SEM photographs of cross-sections of a pre-rolling silver layer.
Figure 10B:
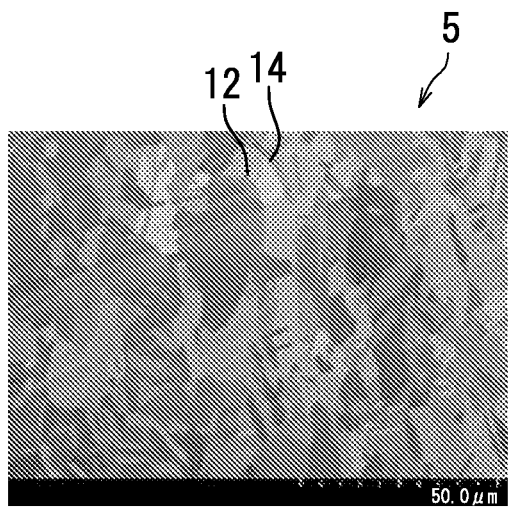
Figure 10C:
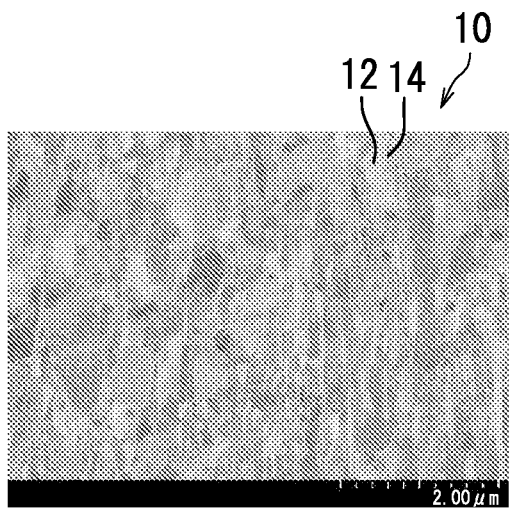
FIGS. 10C and 10D are SEM photographs of cross-sections of a post-rolling bonding member.
Figure 10D:
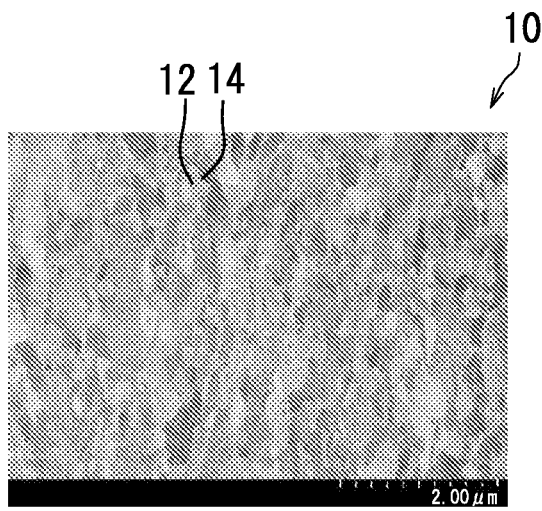

FIG. 10A is an SEM photograph of a cross-section of a pre-rolling silver layer 5 having a thickness of 1 mm FIG. 10B is an SEM photograph of a cross-section of the silver layer 5 shown in FIG. 10A after the silver layer 5 is annealed at 400° C. for 1 hour. FIG. 10C is an SEM photograph of a cross-section of a bonding member 10 obtained as a result of the silver layer 5 shown in FIG. 10B being rolled to have a thickness of 0.1 mm, the cross-section being taken along a direction perpendicular to the rolling direction (i.e., taken in a transverse direction (TD)). FIG. 10D is an SEM photograph of a cross-section of the bonding member 10 obtained as a result of the silver layer 5 shown in FIG. 10B being rolled to have a thickness of 0.1 mm, the cross-section being taken along the rolling direction (RD).

FIG. 11A is an SEM photograph of a cross-section of a pre-rolling silver layer 5 having a thickness of 0.5 mm FIG. 11B is an SEM photograph of a cross-section of the silver layer 5 shown in FIG. 11A after the silver layer 5 is annealed at 400° C. for 1 hour. FIG. 11C is an SEM photograph of a cross-section of a bonding member 10 obtained as a result of the silver layer 5 shown in FIG. 11B being rolled to have a thickness of 0.1 mm, the cross-section being taken along the direction (TD) perpendicular to the rolling direction. FIG. 11D is an SEM photograph of a cross-section of the bonding member 10 obtained as a result of the silver layer 5 shown in FIG. 11B being rolled to have a thickness of 0.1 mm, the cross-section being taken along the rolling direction (RD).

Figure 12A:
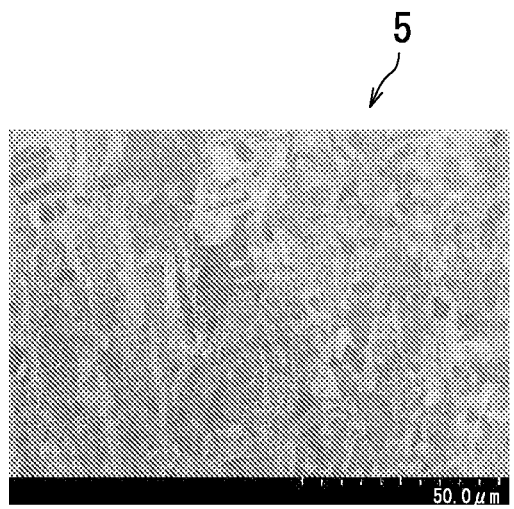
FIGS. 12A and 12B are SEM photographs of cross-sections of a pre-rolling silver layer.
Figure 12B:
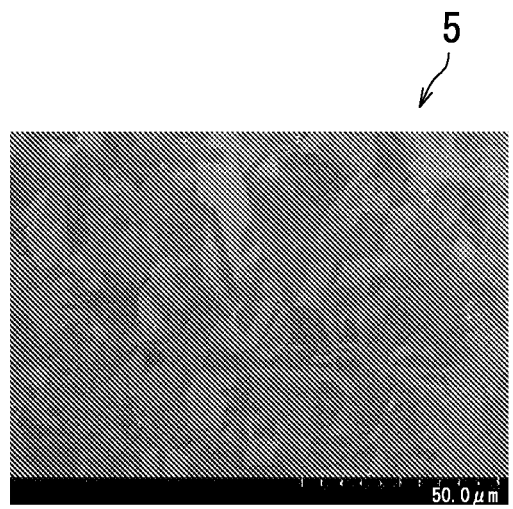
Figure 12C:
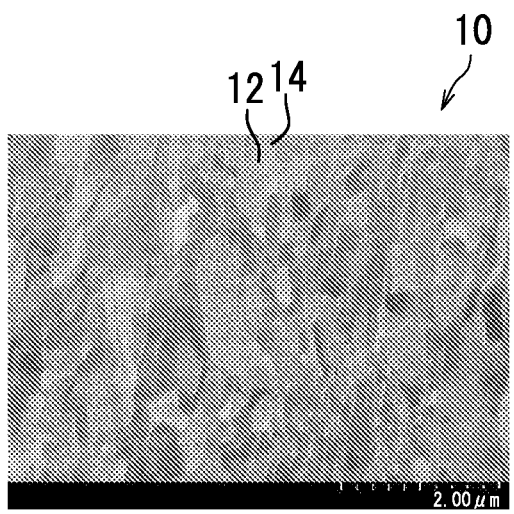
FIGS. 12C and 12D are SEM photographs of cross-sections of a post-rolling bonding member.
Figure 12D:
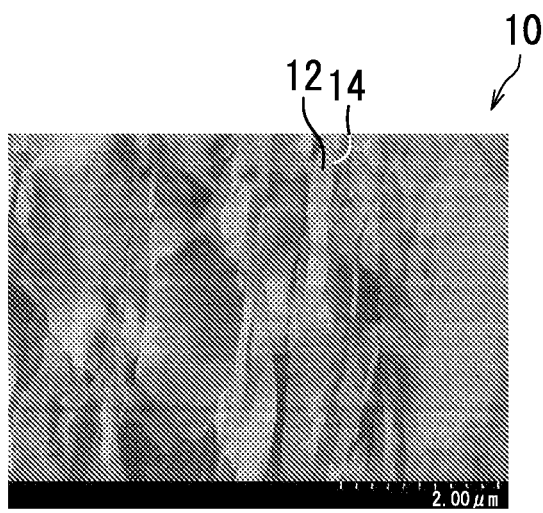

FIG. 12A is an SEM photograph of a cross-section of a pre-rolling silver layer 5 having a thickness of 0.3 mm FIG. 12B is an SEM photograph of a cross-section of the silver layer 5 shown in FIG. 12A after the silver layer 5 is annealed at 400° C. for 1 hour. FIG. 12C is an SEM photograph of a cross-section of a bonding member 10 obtained as a result of the silver layer 5 shown in FIG. 12B being rolled to have a thickness of 0.1 mm, the cross-section being taken along the direction (TD) perpendicular to the rolling direction. FIG. 12D is an SEM photograph of a cross-section of the bonding member 10 obtained as a result of the silver layer 5 shown in FIG. 12B being rolled to have a thickness of 0.1 mm, the cross-section being taken along the rolling direction (RD).

As shown in FIG. 10B, the silver grains 12 in the pre-rolling silver layer 5 are large crystal grains. The silver grains 12 in the pre-rolling silver layer 5 each have a size of 10 μm or longer.

By contrast, as shown in FIGS. 10C and 10D, the silver grains 12 in the post-rolling bonding member 10 are very tiny crystalline grains significantly smaller than the silver grains 12 in the pre-rolling silver layer 5. The silver grains 12 in the post-rolling bonding member 10 each have a size of several ten nanometers.

As shown in FIGS. 10C and 10D, the number of the grain boundaries 14 in the post-rolling bonding member 10 is larger than that of the grain boundaries 14 in the pre-rolling silver layer 5 (FIG. 10B). The number of the grain boundaries 14 in the post-rolling bonding member 10 is 10 or more per micrometer.

Also in the case where the thickness of the pre-rolling silver layer 5 is 0.5 mm, as shown in FIGS. 11C and 11D, the silver grains 12 in the post-rolling bonding member 10 are very tiny crystalline grains significantly smaller than the silver grains 12 in the pre-rolling silver layer 5. The number of the grain boundaries 14 in the post-rolling bonding member 10 is larger than that of the grain boundaries 14 in the pre-rolling silver layer 5 (FIG. 11B).

Also in the case where the thickness of the pre-rolling silver layer 5 is 0.3 mm, as shown in FIGS. 12C and 12D, the silver grains 12 in the post-rolling bonding member 10 are very tiny crystalline grains significantly smaller than the silver grains 12 in the pre-rolling silver layer 5. The number of the grain boundaries 14 in the post-rolling bonding member 10 is larger than that of the grain boundaries 14 in the pre-rolling silver layer 5 (FIG. 12B).

Figure 13A:
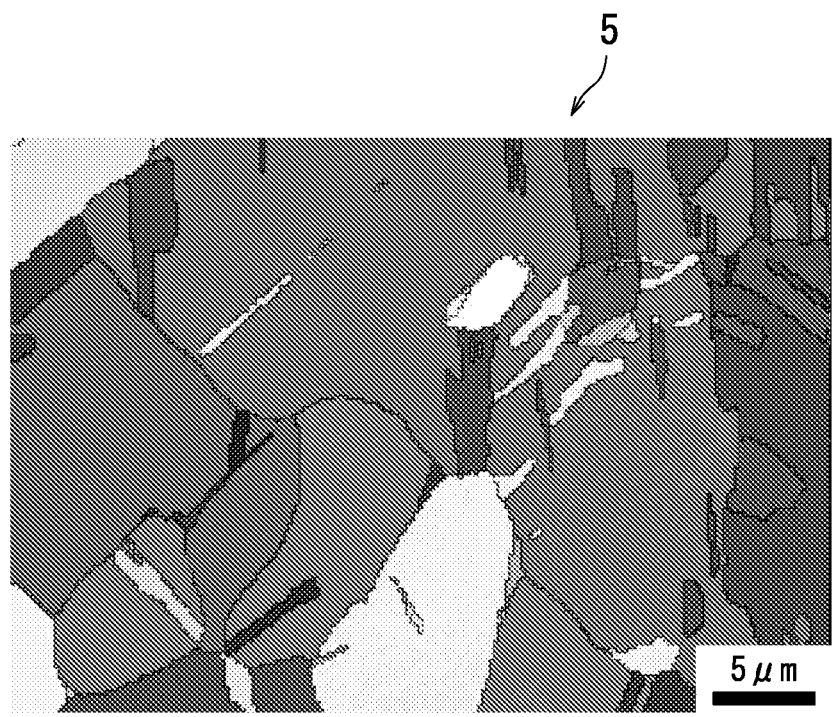
FIG. 13A shows measurement results of EBSD performed on the pre-rolling silver layer.
Figure 13B:
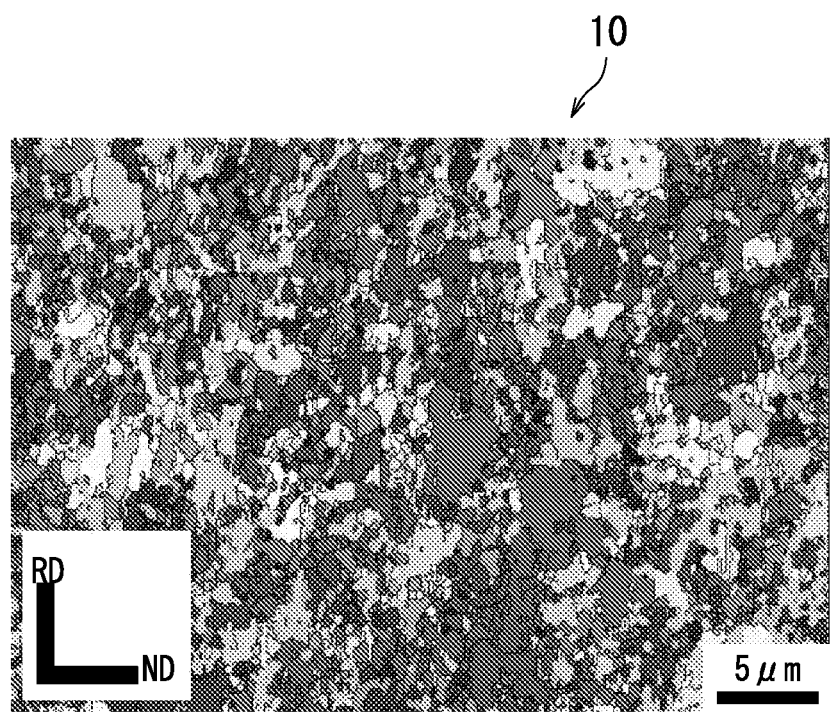
FIG. 13B shows measurement results of EBSD performed on the post-rolling bonding member.
Figure 14:
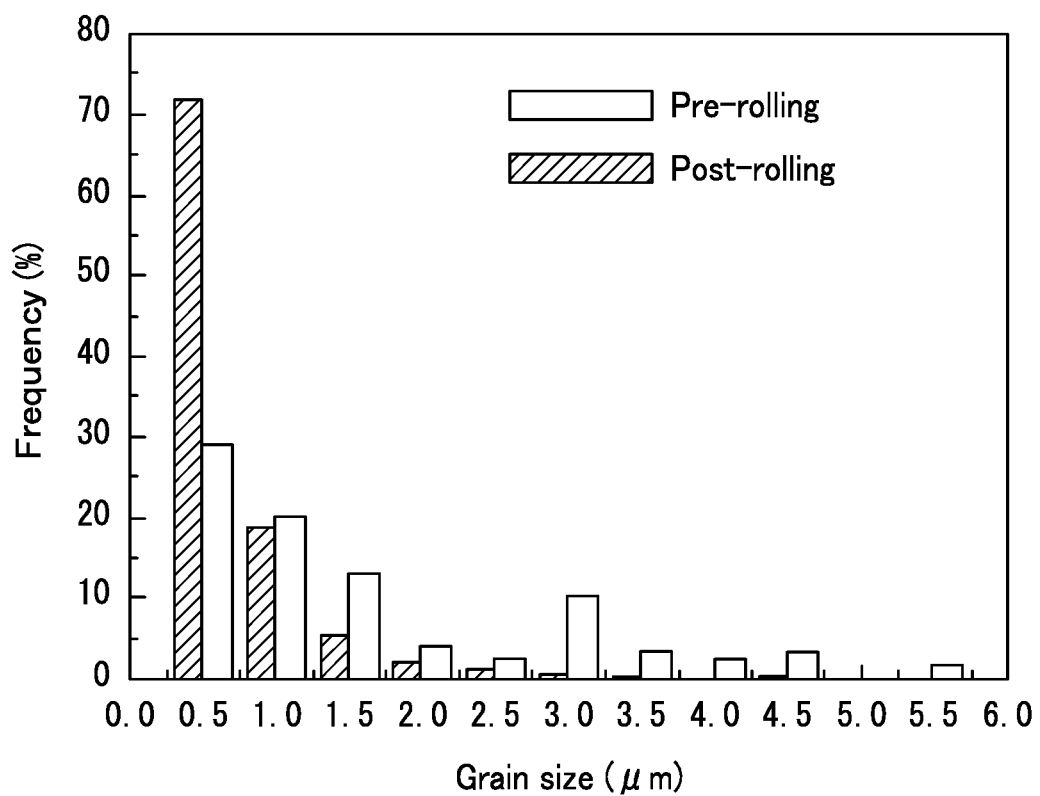
FIG. 14 is a graph showing the relationship between the size of the silver grains and the frequency.

With reference to FIGS. 13A-14, the distribution of the crystalline grains before and after the rolling will be described. FIG. 13A shows measurement results of electron back-scatter diffraction (EBSD) performed on the pre-rolling silver layer 5. FIG. 13B shows measurement results of EBSD performed on the post-rolling bonding member 10. In FIGS. 13A and 13B, the scale is 5 μm. In FIG. 13B, "RD" represents the rolling direction, and "ND" represents a direction perpendicular to the rolling direction (represents the normal direction). FIG. 14 is a graph showing the relationship between the size of the silver grains 12 and the frequency. In FIG. 14, the horizontal axis represents the size of the silver grains, and the vertical axis represents the frequency.

As shown in FIG. 13A, the silver grains 12 in the pre-rolling silver layer 5 are large crystalline grains.

By contrast, as shown in FIG. 13B, the silver grains 12 in the post-rolling bonding member 10 are very tiny crystalline grains significantly smaller than the silver grains 12 in the pre-rolling silver layer 5.

From FIG. 14, it is confirmed that among the silver grains 12 in the post-rolling bonding member 10, the tiny crystalline grains significantly smaller than the silver grains 12 in the pre-rolling silver layer 5 occupy a high ratio. It is also confirmed that the silver grains 12 each have an average grain size of 1 μm or shorter.

As described above with reference to FIGS. 10A-12D, the number of the grain boundaries 14 in the post-rolling bonding member 10 is larger than the number of the grain boundaries 14 in the pre-rolling silver layer 5. Therefore, in the bonding step, a large amount of oxygen in the air can be taken through the boundaries and the defects. This can promote the generation of the liquid silver oxide in the bonding step. As a result, the first bonding target 110 and the second bonding target 120 can be bonded to each other in a favorable manner.

Figure 15A:
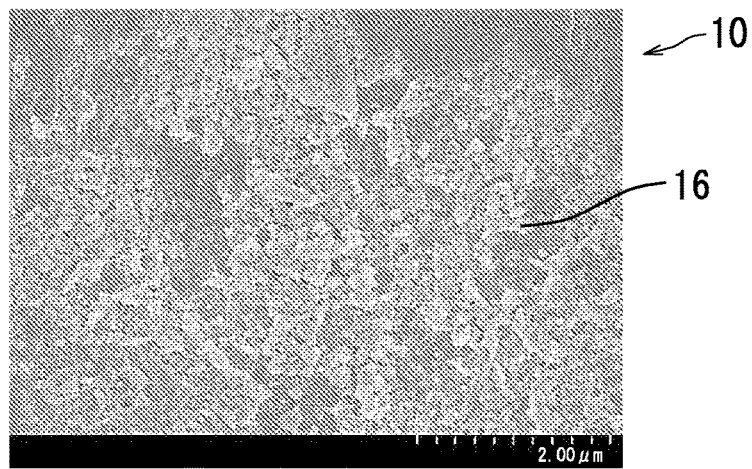
FIGS. 15A-15C are SEM photographs of surfaces of bonding members.
Figure 15B:
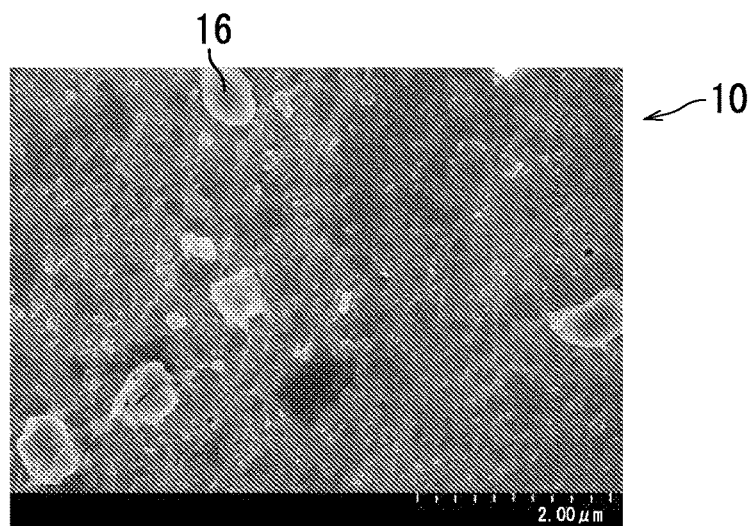
Figure 15C:
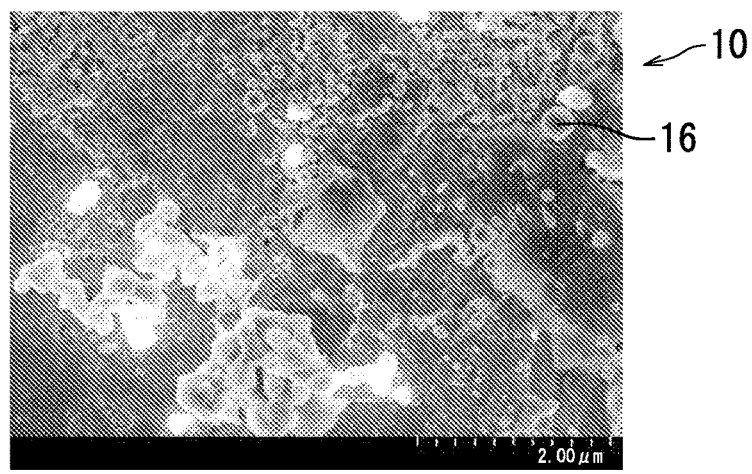
Figure 16A:
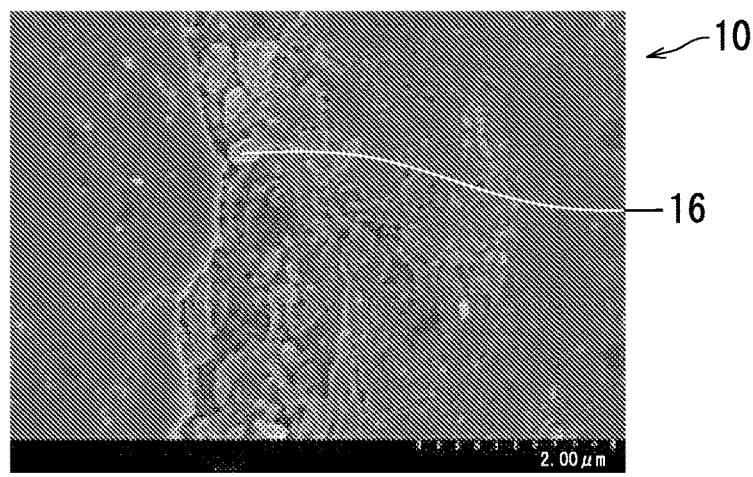
FIGS. 16A-16C are SEM photographs of surfaces of bonding members.
Figure 16B:
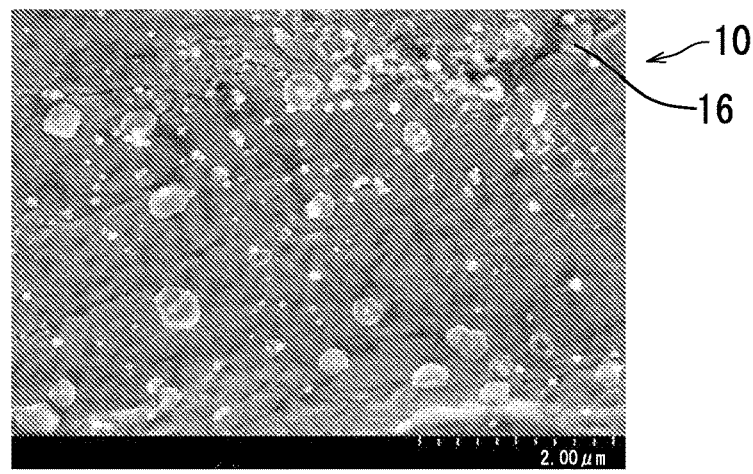
Figure 16C:
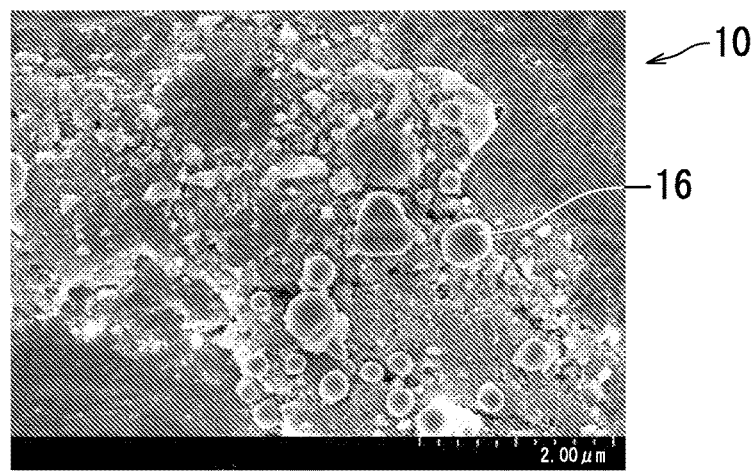
Figure 17A:
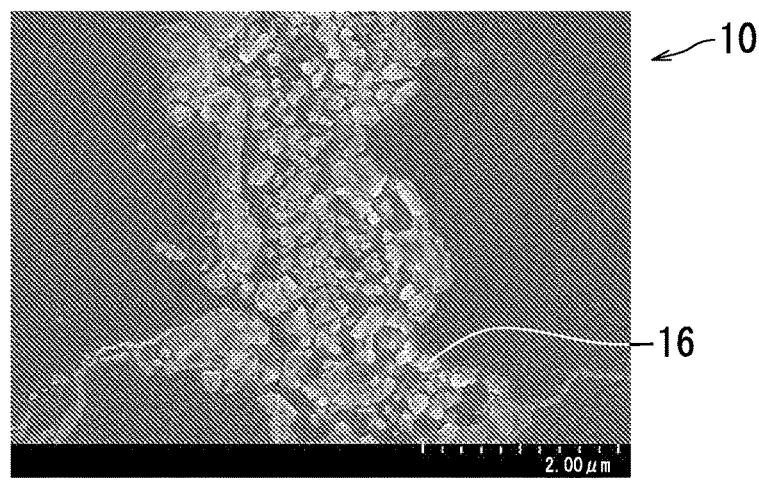
FIGS. 17A-17C are SEM photographs of surfaces of bonding members.
Figure 17B:
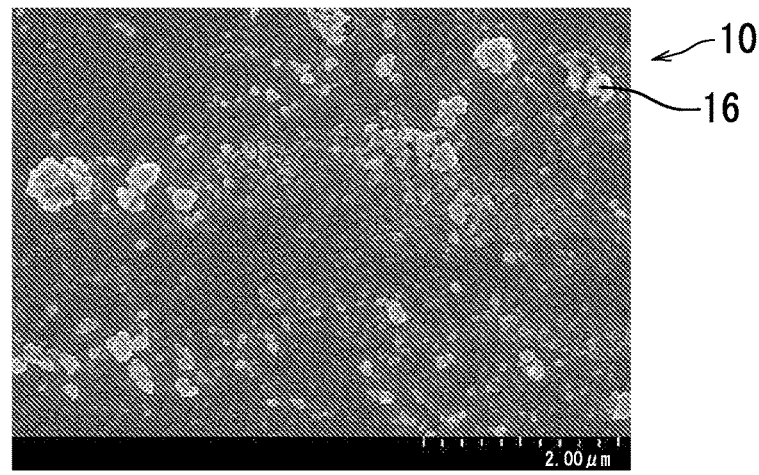
Figure 17C:
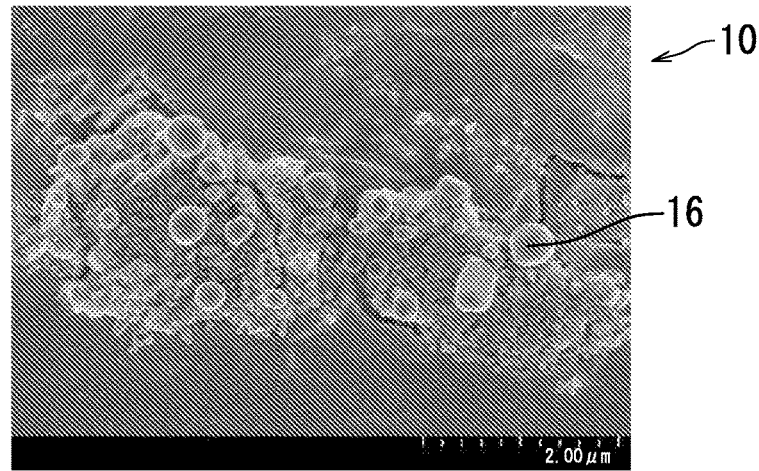

With reference to FIGS. 15A-17C, formation of a hillock will be described. FIGS. 15A-15C, FIGS. 16A-16C, and FIGS. 17A-17C are SEM photographs of surfaces of the bonding members 10. FIGS. 15A-15C are SEM photographs of surfaces of bonding members 10 in the case where the thickness of the pre-rolling silver layer 5 is 1 mm. FIGS. 16A-16C are SEM photographs of surfaces of bonding members 10 in the case where the thickness of the pre-rolling silver layer 5 is 0.5 mm. FIGS. 17A-17C are SEM photographs of surfaces of bonding members 10 in the case where the thickness of the pre-rolling silver layer 5 is 0.3 mm. FIGS. 15A, 16A, and 17A show the bonding members 10 heated at 250° C. FIGS. 15B, 16B, and 17B show the bonding members 10 heated at 300° C. FIGS. 15C, 16C, and 17C show the bonding members 10 heated at 350° C.

As shown in FIGS. 15A-15C, when the bonding member 10 is heated, the liquid silver oxide is moved to the silver surface and gushes out therefrom. When reaching the silver surface, the liquid silver oxide is reduced to be decomposed into silver 16 and oxygen. The silver 16 pushing out at the silver surface is generally called a "hillock". It is confirmed that regardless of whether the heating temperature is 250° C., 300° C., or 350° C., a great number of hillocks of silver 16 gush out from the silver surface.

Similarly, in the case where the thickness of the pre-rolling silver layer 5 is 0.5 mm, it is confirmed from FIGS. 16A-16C that regardless of whether the heating temperature is 250° C., 300° C., or 350° C., a great number of hillocks of silver 16 gush out from the silver surface.

Also in the case where the thickness of the pre-rolling silver layer 5 is 0.3 mm, it is confirmed from FIGS. 17A-17C that regardless of whether the heating temperature is 250° C., 300° C., or 350° C., a great number of hillocks of silver 16 gush out from the silver surface.

As described above with reference to FIGS. 15A-17C, the bonding member 10 is heated, and as a result, a great number of hillocks of silver 16 gush out from the silver surface. Therefore, the first bonding target 110 and the second bonding target 120 can be bonded to each other in a favorable manner.

The residual stresses of the silver sheet in a pre-rolling state and a post-rolling state were measured by use of a residual stress analyzer (μ-X360n) produced by Pulstec Industrial Co., Ltd. As a result, it has been confirmed that the residual stress of a 1.0 mm-thick pre-rolling silver sheet is 14 MPa, whereas the residual stress of the bonding member 10 produced by rolling the silver sheet until the silver sheet has a thickness of 0.1 mm is −51 MPa. In this manner, it has been confirmed that the silver surface 11a and the silver surface 11b are supplied with a compressive stress. Since the silver surface 11a and the silver surface 11b are supplied with a compressive stress, a great number of hillocks of silver 16 can be promoted to gush out from the silver surfaces.

Figure 18:
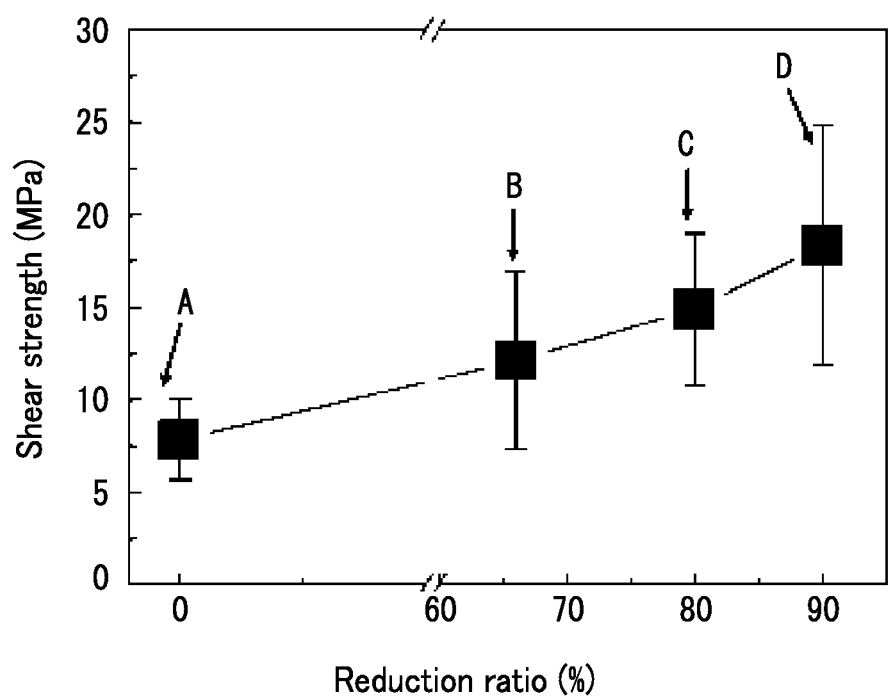
FIG. 18 is a graph showing the shear strength of bonding structures.

With reference to FIG. 18, the shear strength of bonding structures 100 will be described. FIG. 18 is a graph showing the shear strength of the bonding structures 100. In FIG. 18, the horizontal axis represents the reduction ratio of the silver sheet, and the vertical axis represents the shear strength. In FIG. 18, data A is of a bonding structure 100 produced by use of a silver sheet having a thickness of 0.1 mm. Data B is of a bonding structure 100 produced by use of a bonding member 10 produced by rolling a silver sheet having a thickness of 0.3 mm until the thickness of the silver sheet is decreased to 0.1 mm Data C is of a bonding structure 100 produced by use of a bonding member 10 produced by rolling a silver sheet having a thickness of 0.5 mm until the thickness of the silver sheet is decreased to 0.1 mm Data D is of a bonding structure 100 produced by use of a bonding member 10 produced by rolling a silver sheet having a thickness of 1.0 mm until the thickness of the silver sheet is decreased to 0.1 mm.

From FIG. 18, it is confirmed that as the reduction ratio of the silver sheet is raised, the shear strength of the bonding structure 100 is increased. Therefore, it is more preferred that the reduction ratio of the silver sheet is higher.

Figure 19:
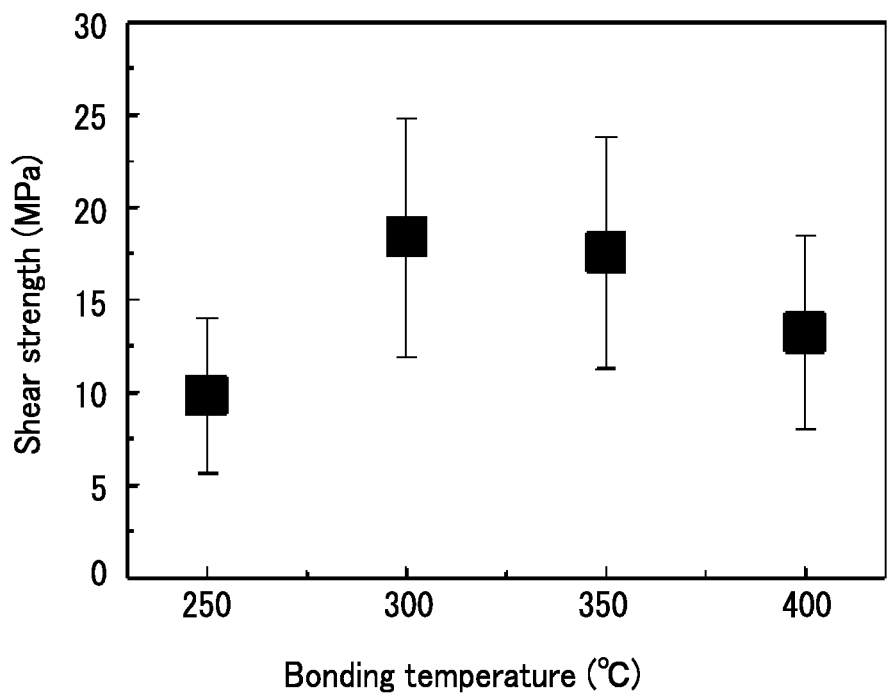
FIG. 19 is a graph showing the relationship between the bonding temperature and the shear strength of a bonding structure.

With reference to FIG. 19, the relationship between the bonding temperature and the shear strength of the bonding structure 100 will be described. FIG. 19 is a graph showing the relationship between the bonding temperature and the shear strength of the bonding structure 100. FIG. 19 shows data of a bonding structure 100 produced by use of a bonding member 10 produced by rolling a silver sheet having a thickness of 1.0 mm until the thickness of the silver sheet is decreased to 0.1 mm.

From FIG. 19, it is confirmed that in the case where the bonding temperature is 300° C. and 350° C., the shear strength is high.

Figure 20:
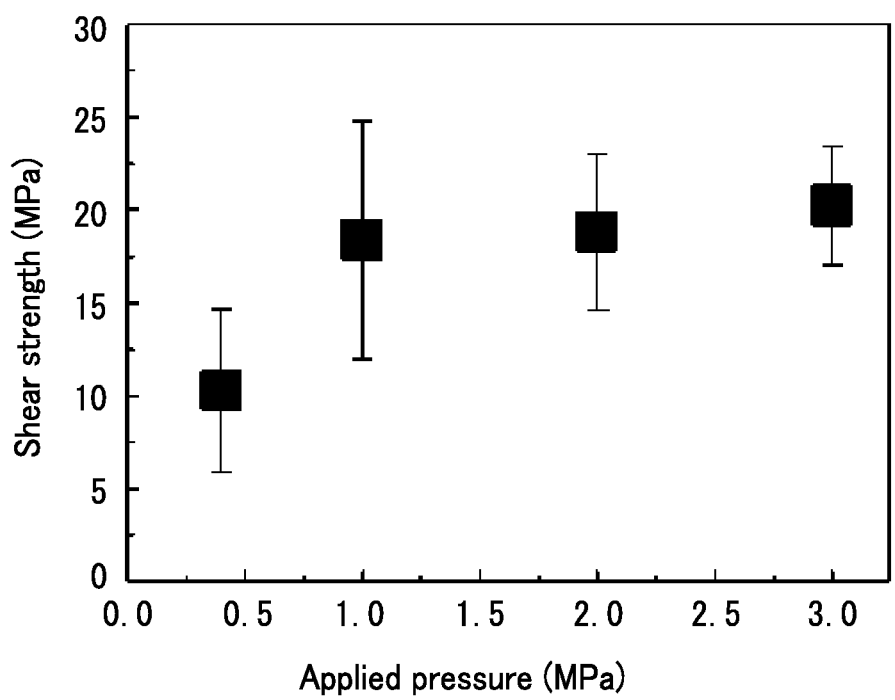
FIG. 20 is a graph showing the relationship between the bonding pressure and the shear strength of a bonding structure.

With reference to FIG. 20, the relationship between the bonding (applied) pressure and the shear strength of the bonding structure 100 will be described. FIG. 20 is a graph showing the relationship between the bonding pressure and the shear strength of the bonding structure 100. FIG. 20 shows data of a bonding structure 100 produced by use of a bonding member 10 produced by rolling a silver sheet having a thickness of 1.0 mm until the thickness of the silver sheet is decreased to 0.1 mm.

From FIG. 20, it is confirmed that as the bonding pressure is raised, the shear strength is increased. Therefore, it is more preferred that the bonding pressure is higher.

In the case where the bonding member 10 is used to bond the first bonding target 110 and the second bonding target 120 to each other, it is preferred to, before the bonding step, polish the bonding member 10, the first bonding target 110, and the second bonding target 120.

Figure 21:
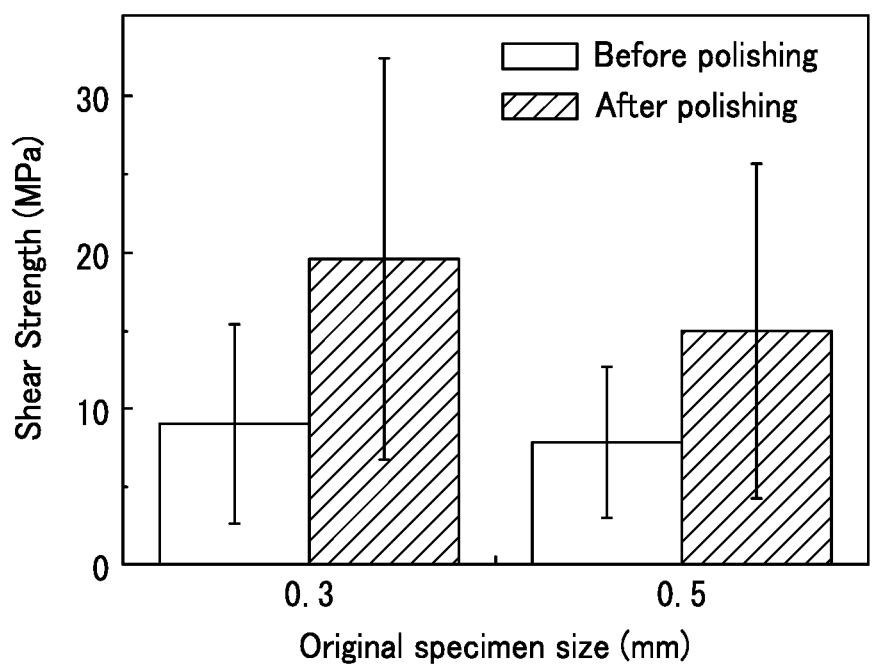
FIG. 21 is a graph showing the shear strength of bonding structures.

With reference to FIG. 21, the shear strength of bonding structures 100 will be described. FIG. 21 is a graph showing the shear strength of the bonding structures 100. In FIG. 21, the horizontal axis represents the pre-rolling (original) thickness of the specimens, and the vertical axis represents the shear strength. The bars with no hatching represent the results of non-polished specimens, and the hatched bars represent the results of polished specimens.

The non-polished specimens have a surface roughness of about 1.0 µm. The polished specimens are formed as follows. Before the bonding step, the surfaces, of the second bonding target 120 and the bonding member 10, which are to be in contact with each other are polished until the surface roughness thereof is decreased to about 0.3 µm.

From FIG. 21, it is confirmed that regardless of whether the pre-rolling thickness of the specimens is 0.3 mm or 0.5 mm, the shear strength is increased by polishing.

The bonding member 10 may be produced by processing a porous silver sheet including pores.

Figure 22A:
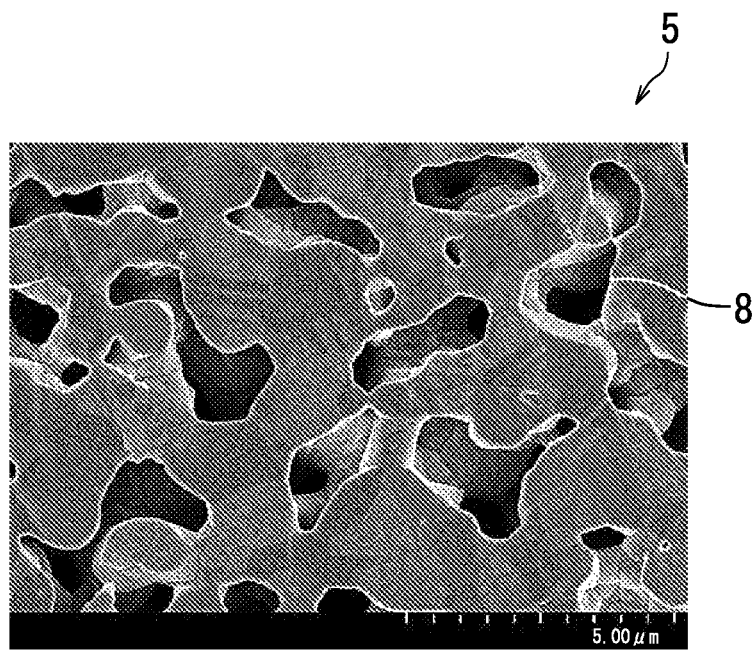
FIG. 22A is an SEM photograph of a surface of a silver layer.

With reference to FIGS. 22A-27, a bonding member 10 produced by processing a porous silver sheet will be described. FIG. 22A is an SEM photograph of a surface of a silver layer 5. FIG. 22B is a schematic view illustrating a bonding member 10. FIGS. 23A-23C are SEM photographs of a surface of a post-rolling bonding member 10. FIGS. 24A-24C are SEM photographs of a cross-section, taken along a direction TD perpendicular to the rolling direction, of the post-rolling bonding member 10. FIGS. 25A-25C are SEM photographs of a cross-section, taken along the rolling direction RD, of the post-rolling bonding member 10. In FIGS. 22A, 23A, 24A, and 25A, the scale is 5 µm. In FIGS. 23B, 24B, and 25B, the scale is 2 µm. In FIGS. 23C, 24C, and 25C, the scale is 1 µm.

Figure 26A:
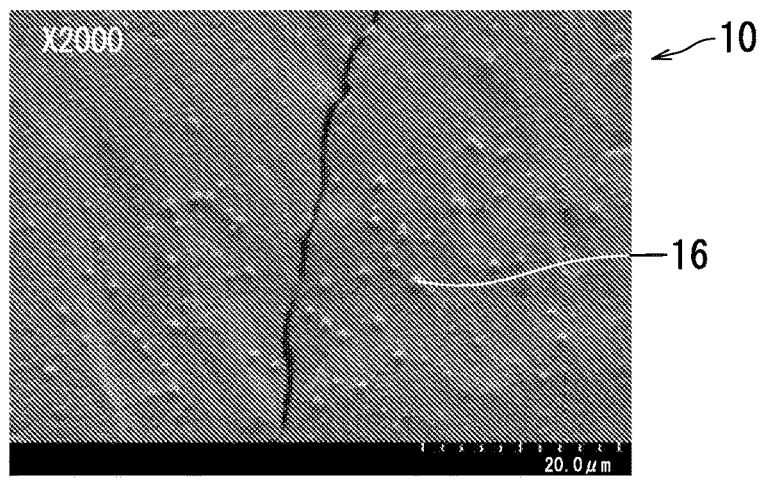
FIGS. 26A-26C are SEM photographs of a surface of the bonding member.
Figure 26B:
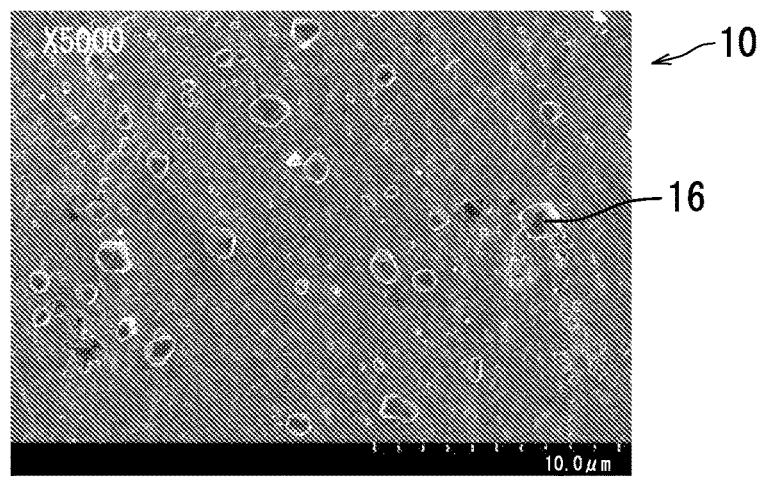
Figure 26C:
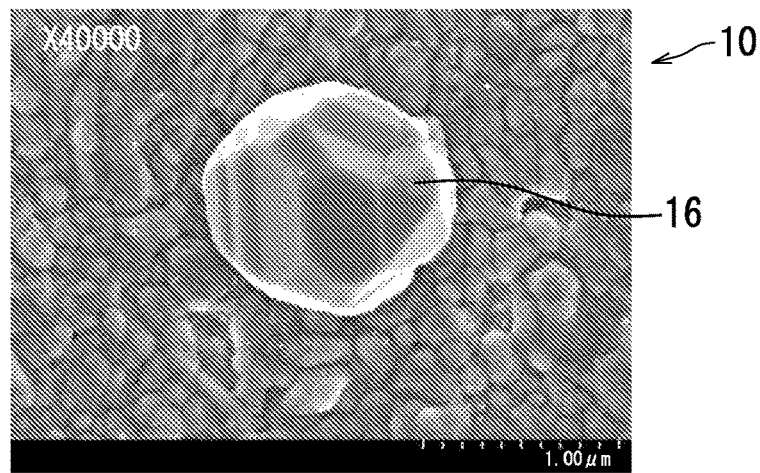

FIGS. 26A-26C are SEM photographs of a surface of the bonding member 10. In FIG. 26A, the scale is 20 µm. In FIG. 26B, the scale is 10 µm. In FIG. 26C, the scale is 1 µm.

Figure 27:
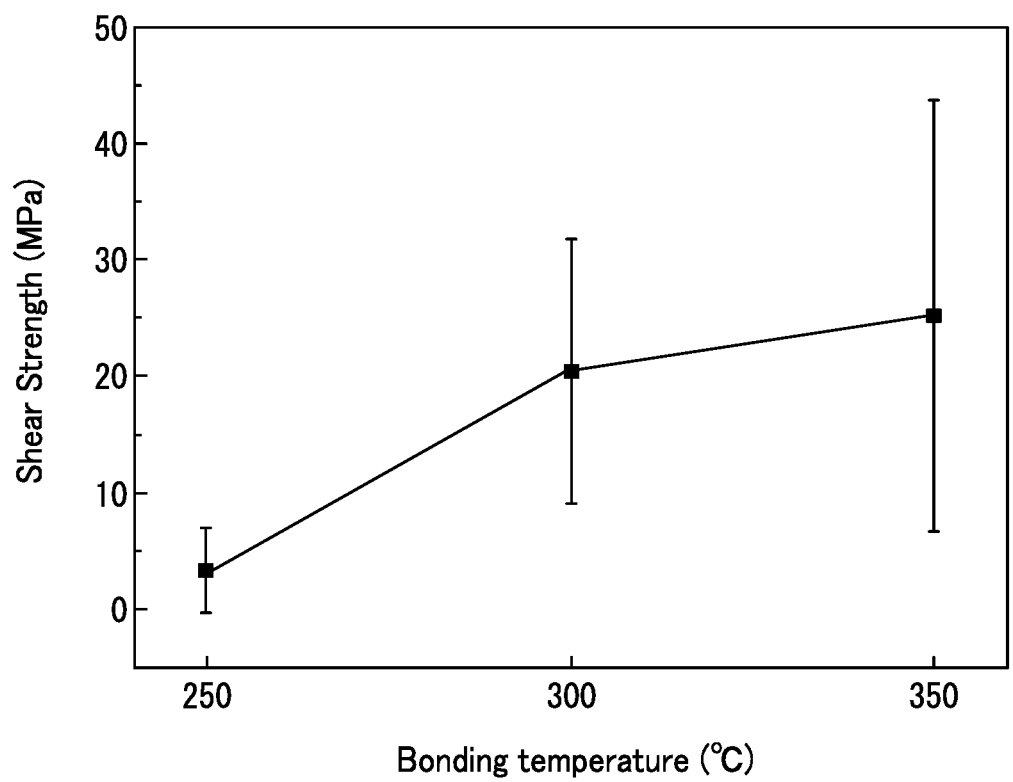
FIG. 27 is a graph showing the relationship between the heating temperature and the shear strength.

FIG. 27 is a graph showing the relationship between the heating (bonding) temperature and the shear strength. In FIG. 27, the horizontal axis represents the heating temperature, and the vertical axis represents the shear strength.

In this embodiment, the silver layer 5 is a porous silver sheet. As shown in FIG. 22A, the silver layer 5 includes a great number of pores 8. The pores 8 each have a size of, for example, 1 µm or longer and 3 µm or shorter.

Figure 22B:
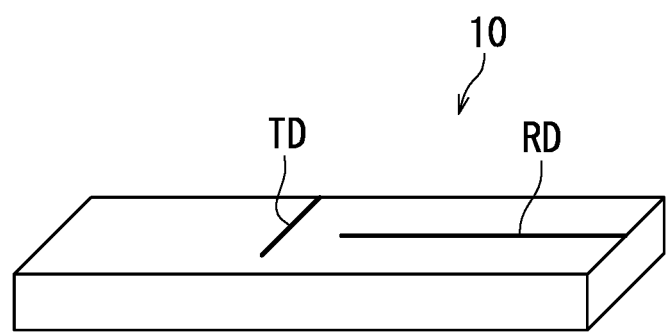
FIG. 22B is a schematic view illustrating a bonding member.

In this embodiment, in the processing step, the surface of the silver layer 5 is physically supplied with a force to be processed, such that the number of the pores 8 at the surface of the silver layer 5 is smaller than in a pre-processing state. In more detail, as illustrated in FIG. 22B, the silver layer 5 is rolled to produce the bonding member 10. In this embodiment, the porous silver sheet has a thickness of 0.5 mm and is rolled until having a thickness of 0.1 mm to produce the bonding member 10.

Figure 23A:
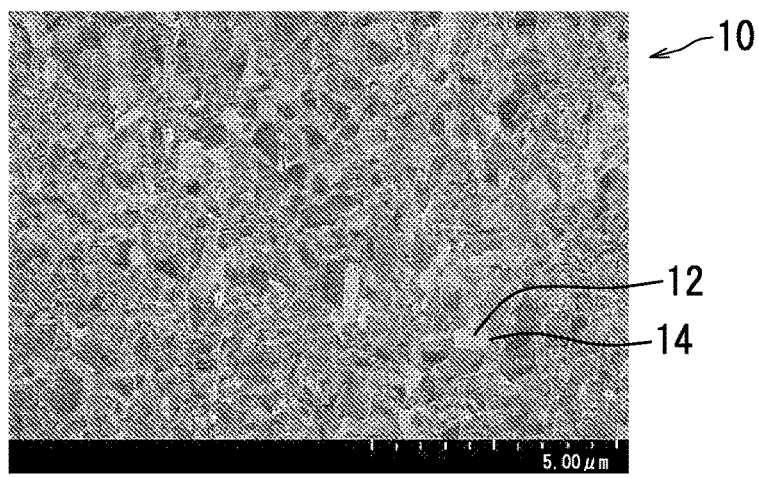
FIGS. 23A-23C are SEM photographs of a surface of a post-rolling bonding member.
Figure 23B:
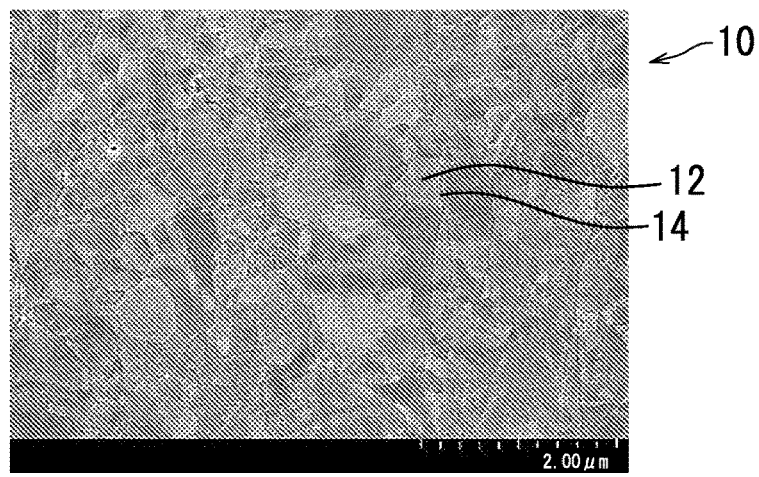
Figure 23C:
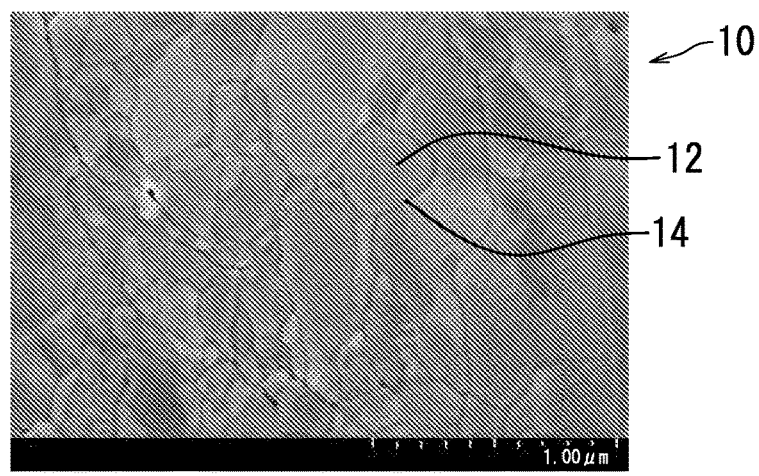

From FIGS. 23A-23C, it is confirmed that the pores 8 in the silver layer 5 at the surface of the bonding member 10 are eliminated by rolling the silver layer 5. The silver grains 12 in the bonding member 10 are very tiny crystalline grains. The silver grains 12 in the post-rolling bonding member 10 each have a size of several ten nanometers. As shown in FIGS. 23A-23C, the number of the grain boundaries 14 in the post-rolling bonding member 10 is 10 or more per micrometer.

Figure 24A:
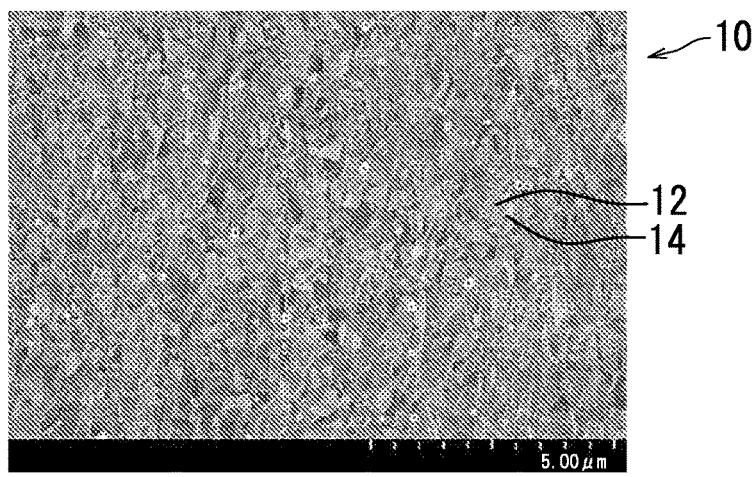
FIGS. 24A-24C are SEM photographs of a cross-section, taken along a direction perpendicular to a rolling direction, of the post-rolling processing bonding member.
Figure 24B:
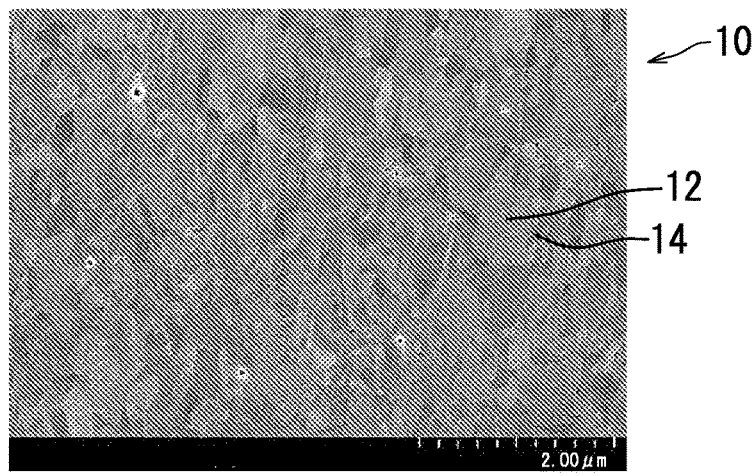
Figure 24C:
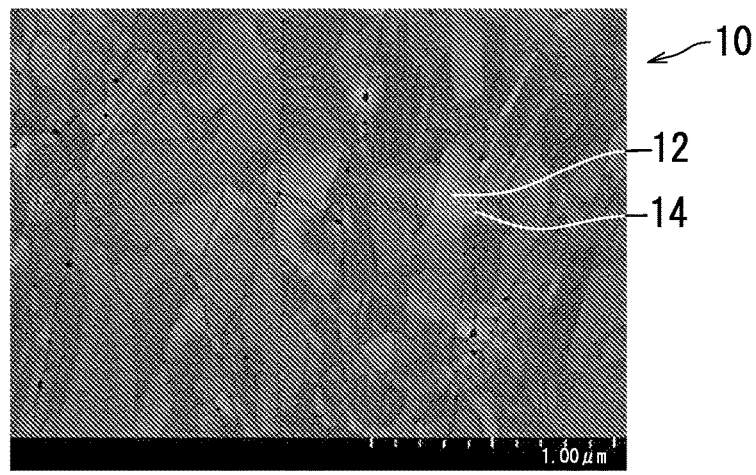

From FIGS. 24A-24C, it is confirmed that the pores 8 in the silver layer 5 at the cross-section taken along the direction TD perpendicular to the rolling direction of the bonding member 10 are eliminated by rolling the silver layer 5. The silver grains 12 in the bonding member 10 are very tiny crystalline grains. The silver grains 12 in the post-rolling bonding member 10 each have a size of several ten nanometers. As shown in FIGS. 24A-24C, the number of the grain boundaries 14 in the post-rolling bonding member 10 is 10 or more per micrometer.

Figure 25A:
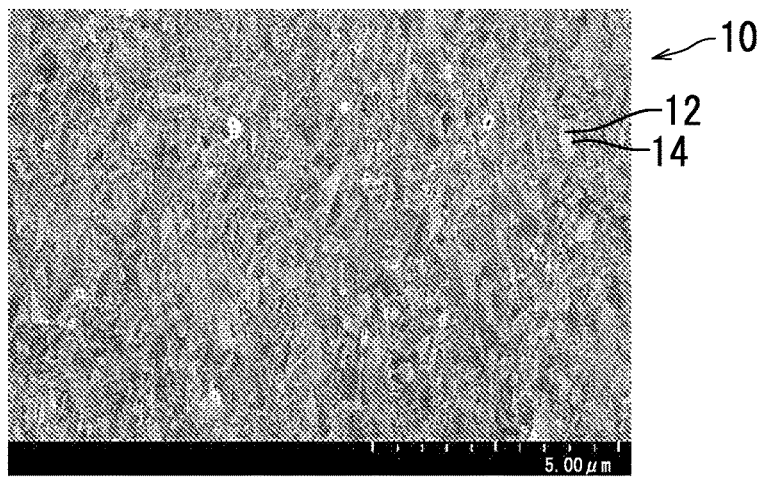
FIGS. 25A-25C are SEM photographs of a cross-section, taken along the rolling direction, of the post-rolling bonding member.
Figure 25B:
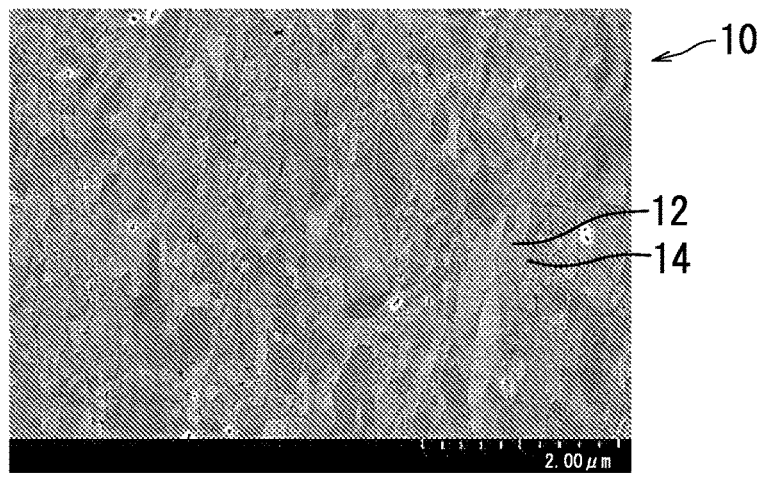
Figure 25C:
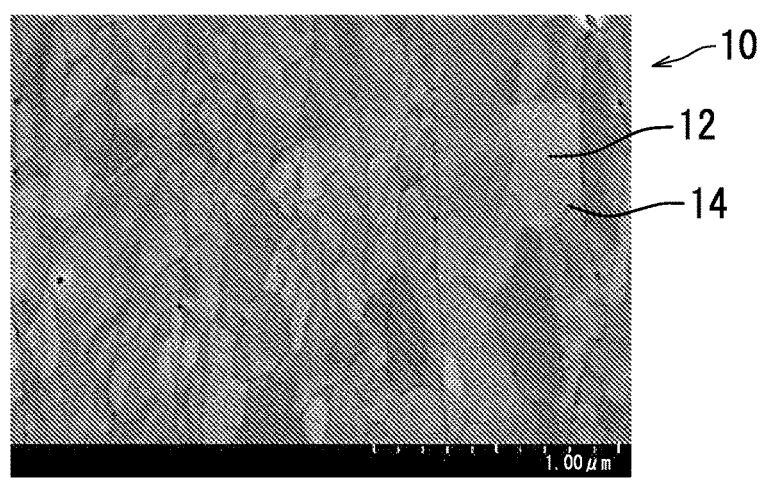

From FIGS. 25A-25C, it is confirmed that the pores 8 in the silver layer 5 at the cross-section taken along the rolling direction RD of the bonding member 10 are eliminated by rolling the silver layer 5. The silver grains 12 in the bonding member 10 are very tiny crystalline grains. The silver grains 12 in the post-rolling bonding member 10 each have a size of several ten nanometers. As shown in FIGS. 25A-25C, the number of the grain boundaries 14 in the post-rolling bonding member 10 is 10 or more per micrometer.

As described above with reference to FIGS. 22A-25C, it is confirmed that the pores 8 are eliminated from the entirety of the bonding member 10 and very tiny crystalline grains are formed in the entirety of the bonding member 10 as a result of processing (rolling) the porous silver sheet. It is also confirmed that a great number of tiny grain boundaries are formed in the entirety of the bonding member 10.

FIGS. 26A-26C are SEM photographs of a surface of the bonding member 10 shown in FIGS. 24A-26C after the bonding member 10 is heated. The bonding member 10 was heated at a heating temperature of 250° C. for 30 minutes. From FIGS. 26A-26C, it is confirmed that when the bonding member 10 is heated, a great number of hillocks of silver 16 gush out at the silver surface.

FIG. 27 is as graph showing the relationship between the heating (bonding) temperature and the shear strength of a bonding structure 100 produced by use of the bonding member 10 shown in FIGS. 24A-26C. As shown in FIG. 27, as the heating temperature is raised, the shear strength is increased. In the case where the heating temperature is 250° C., the shear strength is 1.8 MPa to 8.88 MPa. In the case where the heating temperature is 300° C., the shear strength is 18.88 MPa to 27.77 MPa. In the case where the heating temperature is 350° C., the shear strength is 27.77 MPa to 59.77 MPa.

As described above with reference to FIG. 27, the bonding structure 100 has a large shear strength, and thus the first bonding target 110 and the second bonding target 120 are bonded to each other in a favorable manner. Especially in the case where the heating temperature is 350° C., the shear strength is 59.77 MPa at the highest, and the first bonding target 110 and the second bonding target 120 are bonded to each other in a highly favorable manner.

The bonding structures 100 described above with reference to FIGS. 10A-27 are produced by use of the rolled bonding members 10. Alternatively, a bonding member 10 produced by grinding (polishing) the surface of the silver layer 5 may be used to produce a bonding structure 100.

Figures 30A, 30B, 30C:
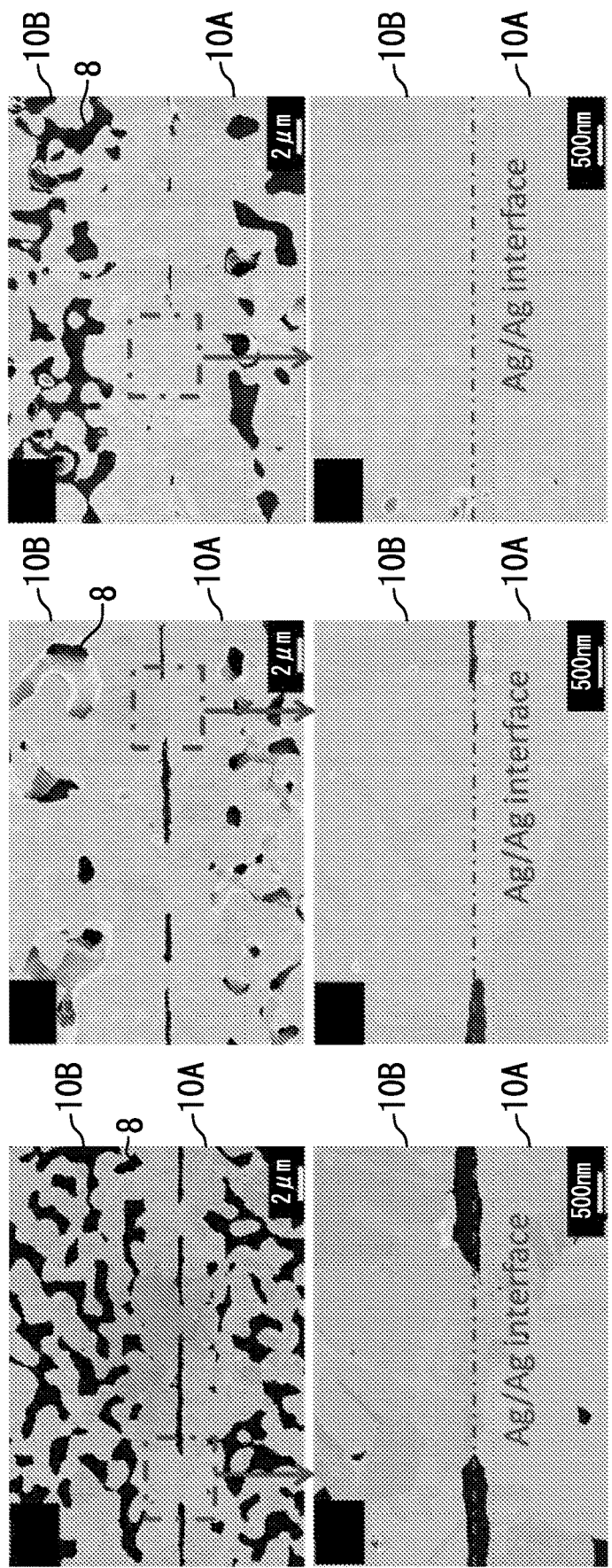
FIGS. 30A-30C are SEM photographs of cross-sections of, and in the vicinity of, an interface between the bonding members.
Figure 31A:
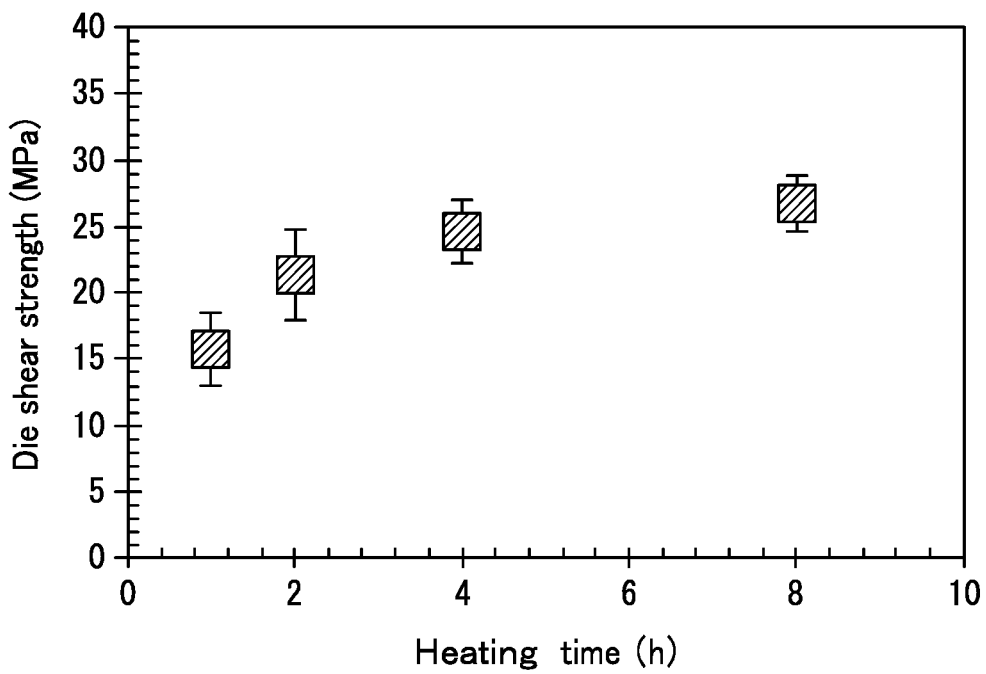
FIG. 31A is a graph showing the relationship between the heating time and the shear strength.
Figure 31B:
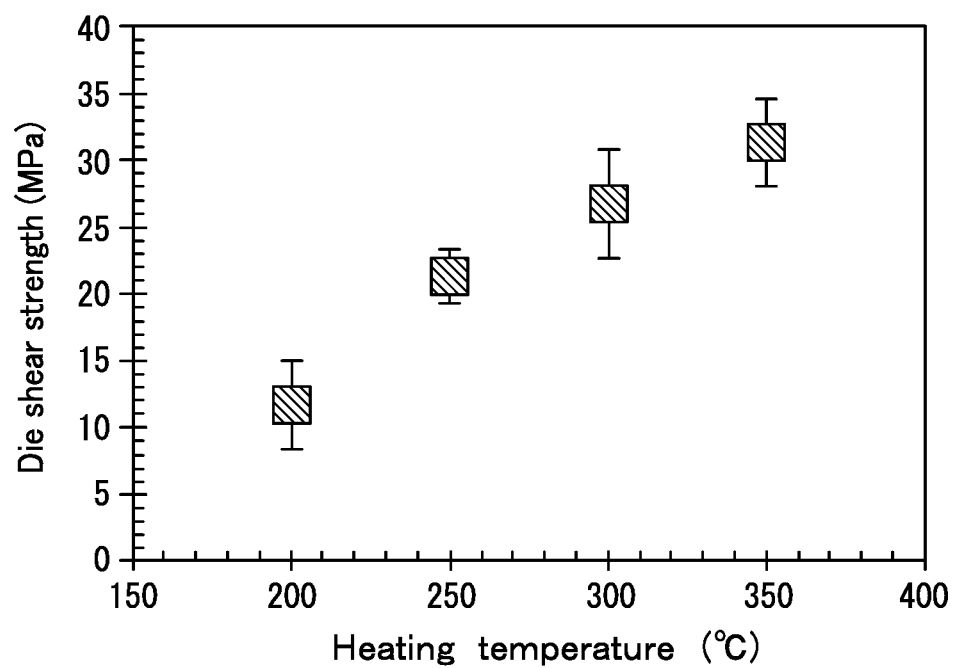
FIG. 31B is a graph showing the relationship between the heating temperature and the shear strength.
Figure 32:
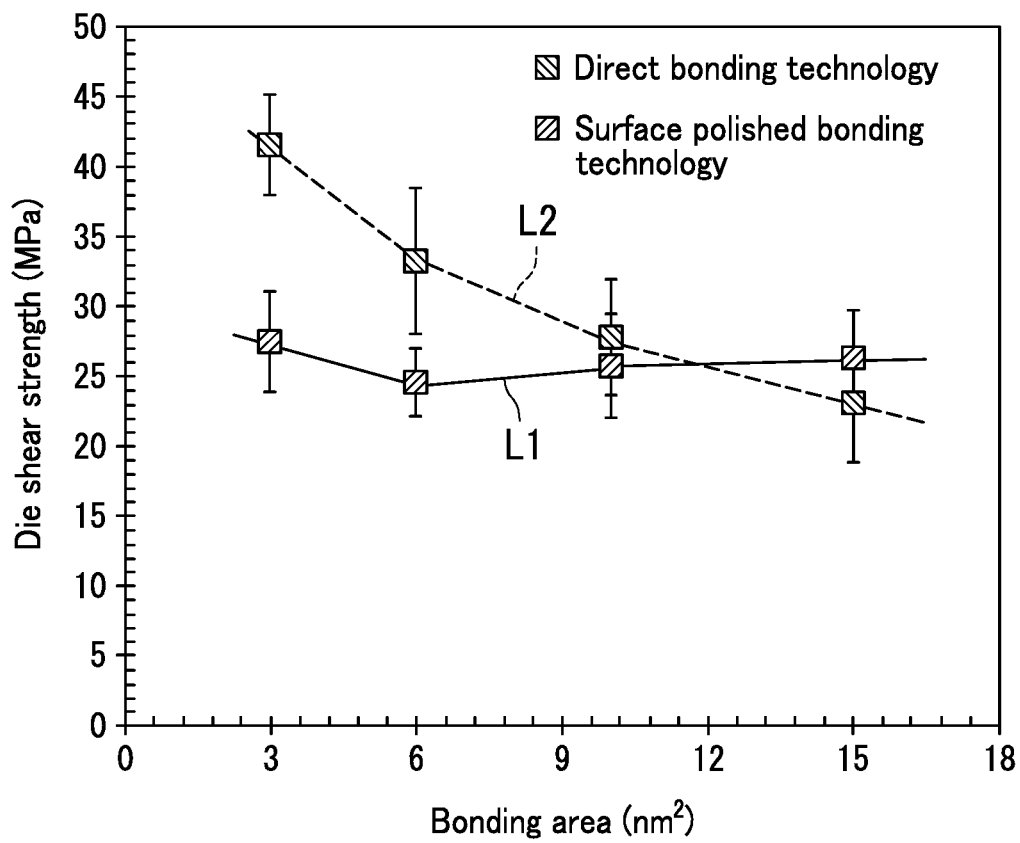
FIG. 32 is a graph showing the relationship between the bonding area and the shear strength.
Figure 33A:
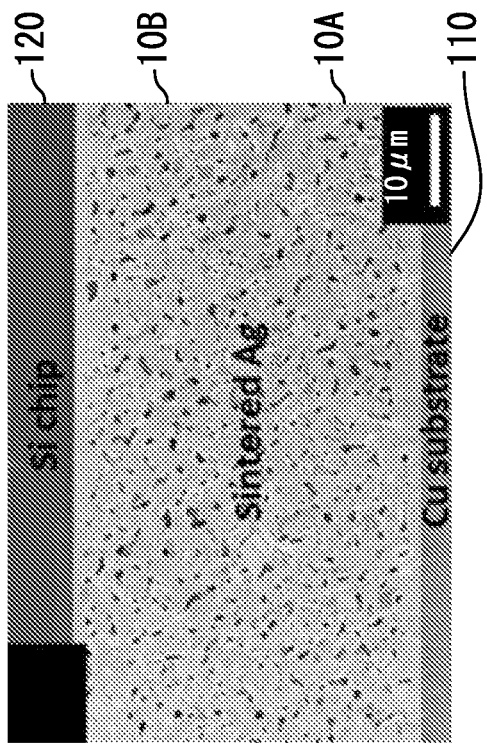
FIGS. 33A and 33B are SEM photographs of cross-sections of, and in the vicinity of, an interface between the bonding members.
Figure 33B:
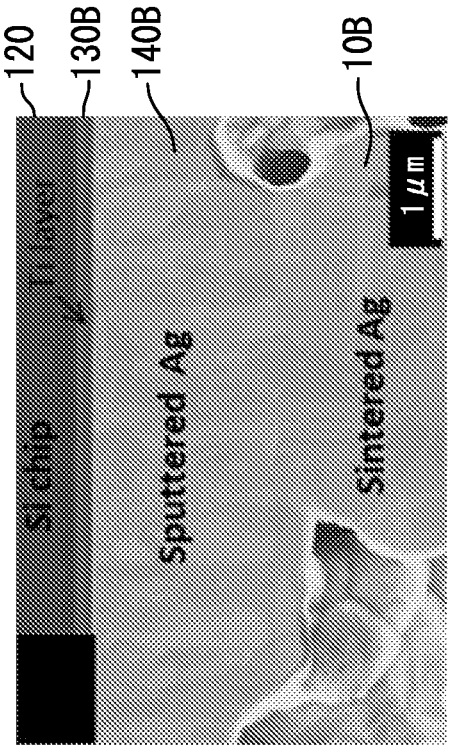
Figure 33C:
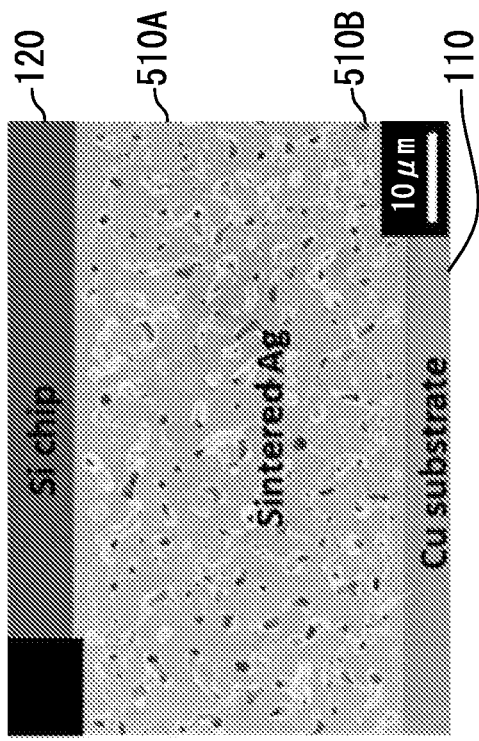
FIGS. 33C and 33D are SEM photographs of cross-sections of, and in the vicinity of, an interface between bonding members in a comparative example.
Figure 33D:
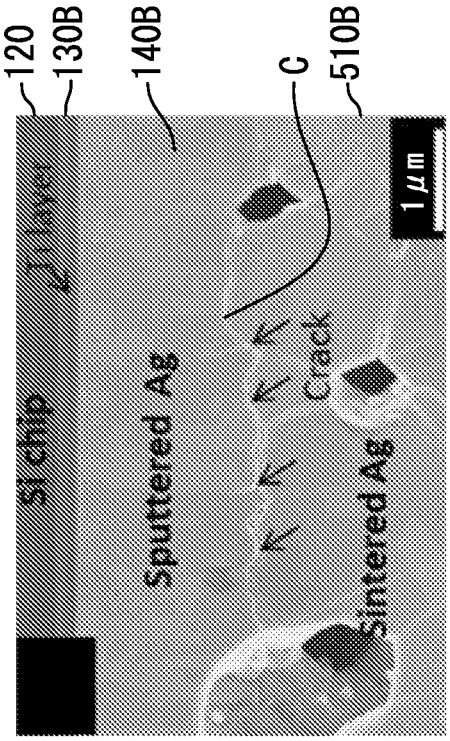

With reference to FIGS. 28A-33D, an embodiment of a method for producing a bonding structure 100 according to the present invention will be described. FIGS. 28A-28D are schematic views illustrating a method for producing the bonding structure 100 according to the present invention. FIGS. 29A-29D are SEM photographs of cross-sections corresponding to FIGS. 28A-28D. FIG. 30A-30C are SEM photographs of cross-sections of, and in the vicinity of, an interface between the bonding member 10A and the bonding member 10B. FIG. 31A is a graph showing the relationship between the heating time and the shear strength. FIG. 31B is a graph showing the relationship between the heating temperature and the shear strength. FIG. 32 is a graph showing the relationship between the bonding area and the shear strength. FIGS. 33A and 33B are SEM photographs of cross-sections of, and in the vicinity of, an interface between the bonding member 10A and the bonding member 10B. FIGS. 33C and 33D are SEM photographs of cross-sections of, and in the vicinity of, an interface between bonding members 510A and 510B in comparative examples.

Figure 28A:
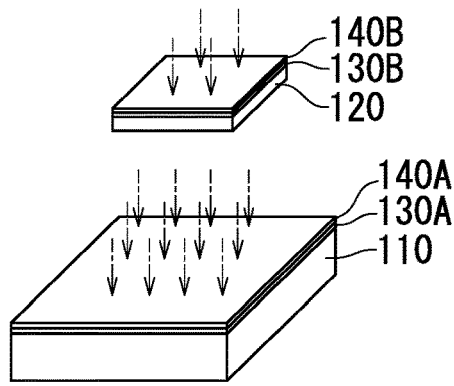
FIGS. 28A-28D are schematic views illustrating a method for producing a bonding structure according to the present invention.
Figure 29A:
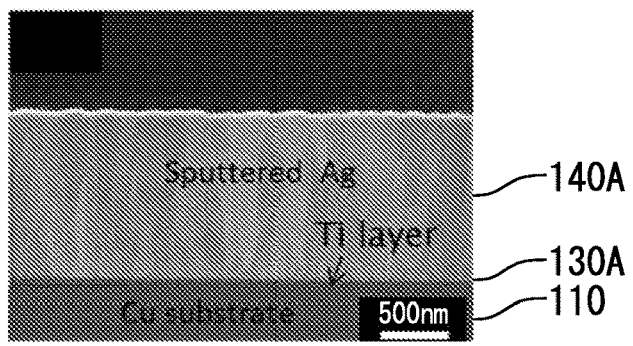
FIGS. 29A-29D are SEM photographs of cross-sections corresponding to FIGS. 28A-28D.

As illustrated in FIG. 28A, in the preparation step, the first bonding target 110 is prepared. The first bonding target 110 is a copper substrate. The adhesive layer 130A is formed on the surface of the first bonding target 110 by sputtering. The adhesive layer 130A is formed of titanium. The silver layer 140A is formed on the surface of the adhesive layer 130A. The silver layer 140A is formed of silver. As shown in FIG. 29A, the adhesive layer 130A (titanium) and the silver layer 140A (silver) are stacked on the surface of the first bonding target 110 (copper substrate).

As illustrated in FIG. 28A, in the preparation step, the second bonding target 120 is prepared. The second bonding target 120 is a silicon substrate. The adhesive layer 130B is formed on the surface of the second bonding target 120 by sputtering. The adhesive layer 130B is formed of titanium. The silver layer 140B is formed on the surface of the adhesive layer 130B. The silver layer 140B is formed of silver.

Figure 28B:
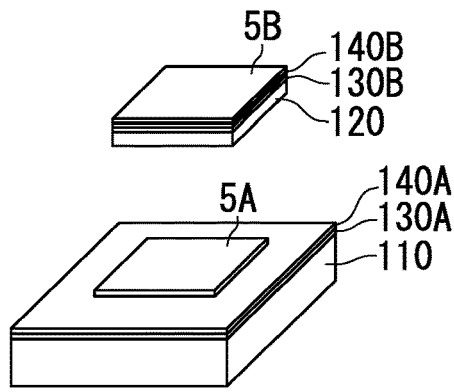
Figure 29B:
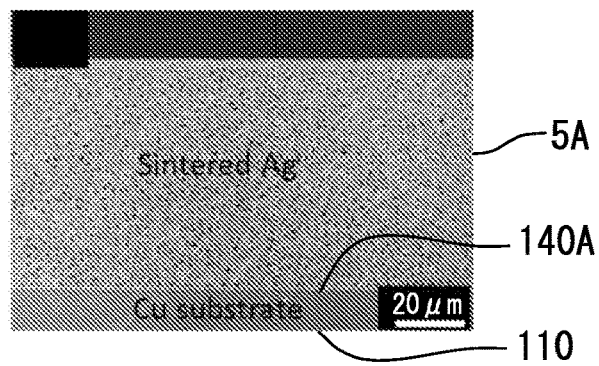

Next, as illustrated in FIG. 28B, a silver layer 5A is formed on a surface of the silver layer 140A. A silver layer 5B is formed on a surface of the silver layer 140B. The silver layer 5A and the silver layer 5B are silver pastes. The silver layer 5A and the silver layer 5B are heated to be pre-sintered. As shown in FIG. 29B, the pre-sintered silver layer 5A includes a great number of pores 8.

Figure 28C:
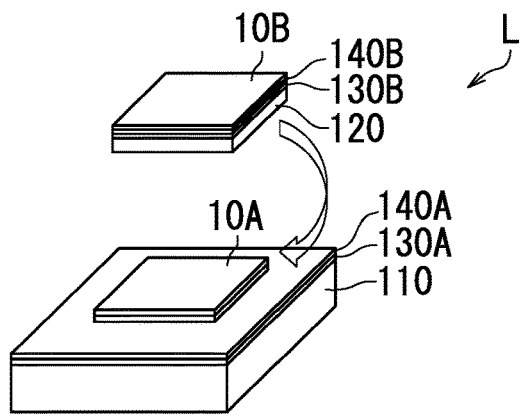
Figure 29C:
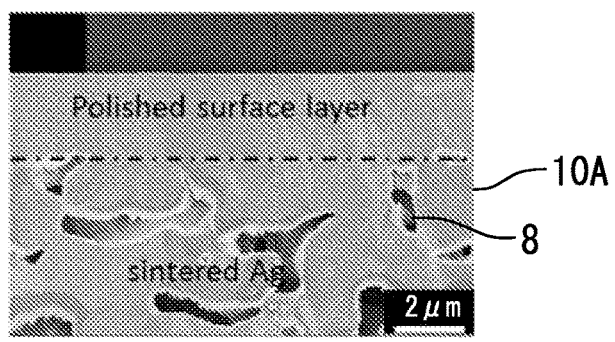

Next, as illustrated in FIG. 28C, a surface of the silver layer 5A and a surface of the silver layer 5B are ground (polished). As a result of being ground, the silver layer 5A and the silver layer 5B respectively become the bonding member 10A and the bonding member 10B. As shown in FIG. 29C, as a result of grinding the surface of the silver layer 5A, the pores 8 are eliminated from the surface, and the vicinity thereof, of the bonding member 10A. As illustrated in FIG. 28C, the first bonding target 110 and the second bonding target 120 are stacked on each other such that the bonding member 10A and the bonding member 10B are in contact with each other. Thus, the stack body L is formed.

Figure 28D:
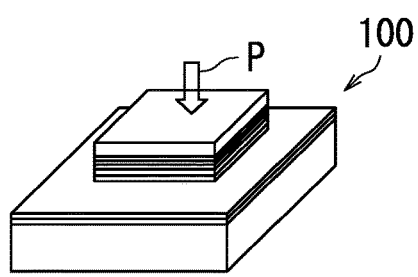
Figure 29D:
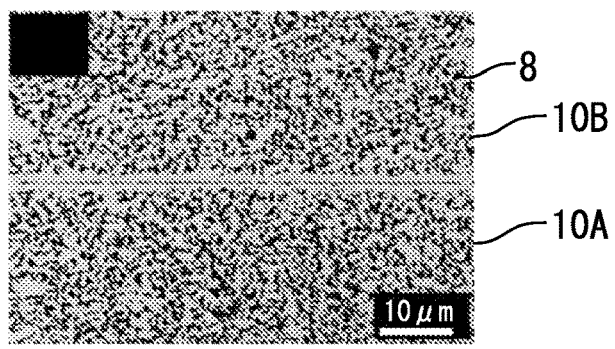

Next, as illustrated in FIG. 28D, the stack body L is heated while being pressurized to bond the first bonding target 110 and the second bonding target 120 to each other. As a result, the bonding structure 100 is produced. As shown in FIG. 29D, no pores 8 are formed at, or in the vicinity of, the interface between the bonding member 10A and the bonding member 10B. Thus, it is confirmed that the first bonding target 110 and the second bonding target 120 are bonded to each other in a favorable manner.

With reference to FIGS. 30A-30C, bonding at, and in the vicinity of, the interface between the bonding member 10A and the bonding member 10B will be described. FIG. 30A provides SEM photographs of a cross-section of, and the vicinity thereof, the interface between the bonding member 10A and the bonding member 10B in the bonding structure 100 heated at a heating temperature of 250° C. for 2 hours in the bonding step. FIG. 30B provides SEM photographs of a cross-section of, and the vicinity thereof, the interface between the bonding member 10A and the bonding member 10B in the bonding structure 100 heated at a heating temperature of 250° C. for 4 hours in the bonding step. FIG. 30C provides SEM photographs of a cross-section of, and the vicinity thereof, the interface between the bonding member 10A and the bonding member 10B in the bonding structure 100 heated at a heating temperature of 350° C. for 2 hours in the bonding step.

As shown in the upper photograph of FIG. 30A, the surfaces of the bonding member 10A and the bonding member 10B are ground, and therefore, no pore 8 is formed at, or in the vicinity of, the interface between the bonding member 10A and the bonding member 10B. As shown in the lower photograph of FIG. 30A, a small number of non-bonded portions are present at, or in the vicinity of, the interface between the bonding member 10A and the bonding member 10B.

Similarly, as shown in the upper photograph of FIG. 30B, the surfaces of the bonding member 10A and the bonding member 10B are ground, and therefore, no pore 8 is formed at, or in the vicinity of, the interface between the bonding member 10A and the bonding member 10B. As shown in the lower photograph of FIG. 30B, the non-bonded portions at, or in the vicinity of, the interface between the bonding member 10A and the bonding member 10B are smaller than in the lower photograph of FIG. 30A.

Similarly, as shown in the upper photograph of FIG. 30C, the surfaces of the bonding member 10A and the bonding member 10B are ground, and therefore, no pore 8 is formed at, or in the vicinity of, the interface between the bonding member 10A and the bonding member 10B. As shown in the lower photograph of FIG. 30C, there is no non-bonded portion at, or in the vicinity of, the interface between the bonding member 10A and the bonding member 10B.

As shown in FIG. 31A, as the heating time is extended, the shear strength is increased. As shown in FIG. 31B, as the heating temperature is raised, the shear strength is increased.

FIG. 32 is a graph showing the relationship between the bonding area and the shear strength. Data L1 represents the shear strength of a bonding structure 100 according to the present invention. The surface of the bonding member 10A and the surface of the bonding member 10B in the bonding structure 100 are ground (polished). Data L2 represents the shear strength of a bonding structure in a comparative example. The surfaces of the silver layer are ground (polished).

As represented by data L1 in FIG. 32, in the bonding structure 100, even when the bonding area is enlarged, the shear strength is not decreased much. By contrast, as represented by data L2, in the bonding structure in the comparative example, as the bonding area is enlarged, the shear strength is decreased.

From FIGS. 33A and 33B, it is confirmed that in the bonding structure 100, the silver layer 140B and the bonding member 10A are bonded to each other at the interface therebetween in a favorable manner. By contrast, from FIGS. 33C and 33D, it is confirmed that a crack C is generated between the silver layer 140B and the bonding member 510B.

As described above with reference to FIGS. 32-33B, in the bonding structure 100, the surface of the bonding member 10A and the surface of the bonding member 10B are ground (polished). Therefore, the silver layer 140B and the bonding member 10A are bonded to each other in a favorable manner.

Embodiments of the present invention are described above with reference to the drawings (FIGS. 1-33D). The present invention is not limited to any of the above-described embodiments, and may be carried out in any of various forms without departing from the gist thereof. The drawings mainly illustrate the elements schematically for easier understanding. The thickness, length, number, and the like of each of the elements illustrated in the drawings may be different from the actual thickness, length, number, and the like for the reason related to the drafting of the drawings. The material, shape, size, or the like of each of the elements described in the embodiments is merely an example and is not specifically limiting, and may be altered in any of various manners without substantially departing from the effect of the present invention.

REFERENCE SIGNS LIST 5, 5A, 5B silver layer
8 pore
10, 10A, 10B, 10C bonding member
11a, 11b, 11c, 11d silver surface
12 grain
14 grain boundary
16 silver
100 bonding structure
110 first bonding target
120 second bonding target
L stack body

The invention claimed is:

1. A method for producing a bonding member used for bonding a first bonding target and a second bonding target together through heating, the bonding member having a surface-processed silver surface, the method comprising:
   preparing a silver layer that is porous; and
   processing a surface of the silver layer so as to supply the surface of the silver layer with a compressive stress, wherein
   the bonding member has a thickness of 50 μm or greater and 300 μm or less.

2. The method for producing the bonding member of claim 1, wherein
   in the processing of the surface of the silver layer, the surface of the silver layer is processed such that the number of grain boundaries, between silver grains, at the surface of the silver layer is larger than that in a pre-processing state.

3. The method for producing the bonding member of claim 1, wherein
   the surface-processed silver surface has a residual stress of a negative value due to supply of the compressive stress.

4. The method for producing the bonding member of claim 3, wherein
   in the processing of the surface of the silver layer, the surface of the silver layer is processed such that the number of the pores at the surface of the silver layer is smaller than that in a pre-processing state.

5. The method for producing the bonding member of claim 1, wherein
   in the preparing a silver layer, the silver layer is formed through heating a silver paste.

6. The method for producing the bonding member of claim 1, wherein
   in the processing a surface of the silver layer, the silver surface is ground.

7. A method for producing a bonding structure, comprising:
   preparing a bonding member by the method according to claim 1;
   preparing the first bonding target;
   preparing the second bonding target;
   forming a stack body including the first bonding target, the bonding member, and the second bonding target stacked such that the bonding member is located between the first bonding target and the second bonding target; and
   heating the stack body to bond the first bonding target and the second bonding target to together via the bonding member.

* * * * *